(12) United States Patent
Bessette et al.

(10) Patent No.: US 10,680,413 B2
(45) Date of Patent: Jun. 9, 2020

(54) METHOD FOR HIGH-CONCENTRATION DOPING OF GERMANIUM WITH PHOSPHOROUS

(71) Applicant: Massachusetts Institute of Technology, Cambridge, MA (US)

(72) Inventors: Jonathan T. Bessette, Essex Junction, VT (US); Yan Cai, Cambridge, MA (US); Rodolfo E. Camacho-Aguilera, Cambridge, MA (US); Jifeng Liu, Hanover, NH (US); Lionel Kimerling, Concord, MA (US); Jurgen Michel, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/582,938

(22) Filed: May 1, 2017

(65) Prior Publication Data
US 2018/0198256 A1 Jul. 12, 2018

Related U.S. Application Data

(62) Division of application No. 14/124,004, filed as application No. PCT/US2012/027350 on Mar. 1, 2012, now Pat. No. 9,692,209.
(Continued)

(51) Int. Cl.
*H01L 21/225* (2006.01)
*H01S 5/30* (2006.01)
(Continued)

(52) U.S. Cl.
CPC ........ *H01S 5/3027* (2013.01); *H01L 21/0237* (2013.01); *H01L 21/0245* (2013.01);
(Continued)

(58) Field of Classification Search
CPC .... H01L 21/22; H01L 21/225; H01L 21/2251
See application file for complete search history.

(56) References Cited

U.S. PATENT DOCUMENTS 3,502,517 A * 3/1970 Sussmann ............... H01L 21/00
148/DIG. 122
4,392,297 A * 7/1983 Little .................. H01L 31/0693
136/261
(Continued)

FOREIGN PATENT DOCUMENTS

| DE | 1544273 A1 | 9/1969 |
| EP | 249371 A3 | 12/1987 |
| EP | 2202784 A2 | 6/2010 |

OTHER PUBLICATIONS

Scappucci et al., "Ultradense phosphorus in germanium delta-doped layers", Applied Physics Letters, vol. 94, Apr. 2009, 3 pages.*
(Continued)

*Primary Examiner* — Whitney Moore
(74) *Attorney, Agent, or Firm* — Theresa A. Lober

(57) ABSTRACT

In a method for electrically doping a semiconducting material, a layer of germanium is formed having a germanium layer thickness, while in situ incorporating phosphorus dopant atoms at a concentration of at least about $5 \times 10^{18}$ $cm^{-3}$ through the thickness of the germanium layer during formation of the germanium layer. Additional phosphorus dopant atoms are ex situ incorporated through the thickness of the germanium layer, after formation of the germanium layer, to produce through the germanium layer thickness a total phosphorus dopant concentration of at least about $2 \times 10^{19}$ $cm^{-3}$.

12 Claims, 12 Drawing Sheets

Related U.S. Application Data

(60) Provisional application No. 61/495,455, filed on Jun. 10, 2011.

(51) Int. Cl.

| | |
|---|---|
| *H01L 21/02* | (2006.01) |
| *H01L 21/265* | (2006.01) |
| *H01S 5/227* | (2006.01) |
| *H01S 5/32* | (2006.01) |
| *H01S 5/042* | (2006.01) |
| *H01S 5/22* | (2006.01) |

(52) U.S. Cl.
CPC .... *H01L 21/0262* (2013.01); *H01L 21/02532* (2013.01); *H01L 21/02576* (2013.01); *H01L 21/02661* (2013.01); *H01L 21/02664* (2013.01); *H01L 21/2254* (2013.01); *H01L 21/26513* (2013.01); *H01S 5/227* (2013.01); *H01S 5/3086* (2013.01); *H01S 5/3223* (2013.01); *H01S 5/0421* (2013.01); *H01S 5/0422* (2013.01); *H01S 5/2214* (2013.01); *H01S 5/3054* (2013.01)

(56) References Cited

U.S. PATENT DOCUMENTS

| | | | | |
|---|---|---|---|---|
| 4,593,307 | A | 6/1986 | Rupprecht | |
| 4,814,838 | A * | 3/1989 | Kuroda | H01L 29/205 257/190 |
| 5,116,784 | A * | 5/1992 | Ushikawa | H01L 21/02532 118/50 |
| 5,332,689 | A * | 7/1994 | Sandhu | H01L 21/02381 148/DIG. 38 |
| 6,599,781 | B1 * | 7/2003 | Li | H01L 21/268 257/140 |
| 6,812,495 | B2 * | 11/2004 | Wada | H01L 21/02381 257/103 |
| 6,946,318 | B2 * | 9/2005 | Wada | H01L 21/02381 257/103 |
| 7,294,848 | B2 * | 11/2007 | Bahl | H01L 33/0054 257/102 |
| 7,394,111 | B2 * | 7/2008 | Forbes | C30B 1/023 257/191 |
| 7,560,351 | B2 * | 7/2009 | Hofmann | H01L 21/28518 257/309 |
| 7,596,158 | B2 * | 9/2009 | Liu | B82Y 20/00 372/43.01 |
| 7,858,965 | B2 * | 12/2010 | Lu | B82Y 10/00 257/19 |
| 7,906,413 | B2 * | 3/2011 | Cardone | H01L 21/02381 117/936 |
| 9,177,812 | B2 * | 11/2015 | Martens | H01L 21/28525 |
| 9,202,693 | B2 * | 12/2015 | Wang | H01L 21/26506 |
| 2007/0287272 | A1 * | 12/2007 | Bauer | H01L 21/02529 438/485 |
| 2010/0167446 | A1 * | 7/2010 | Nguyen | H01L 21/02532 438/57 |
| 2012/0003819 | A1 * | 1/2012 | Francis | C23C 16/30 438/478 |
| 2012/0024223 | A1 * | 2/2012 | Torres, Jr. | C23C 16/24 117/104 |
| 2012/0244688 | A1 * | 9/2012 | Bauer | H01L 21/02529 438/507 |

OTHER PUBLICATIONS

Cai et al., "High phosphorous doped germanium: Dopant diffusion and modeling", Journal of Applied Physics, vol. 112, 034509, Aug. 2012, 5 pages.*

PCT/US2012/027350, International Search Report, Form PCT/ISA/210 second sheet, continuation of second sheet, and patent family annex pp. 1-3, dated Sep. 2012.
PCT/US2012/027350, Written Opinion of the International Searching Authority, PCT/ISA/237 cover sheet, sheets for Box I, Box III, Box IV, and Box V, and separate sheet sheets 1-4, dated Dec. 2013.
Bessett et al., "High n-type Doping for Ge Lasers," OSA Integrated Photonic Research (IPR), Silicon and Nanophotonics 2011, Photonic Integration (ITuC5), OSA/ANIC/IPR/Sensors/SL/SOF/SPPCom/2011, Toronto, CA, pp. 1-3, Jun. 12-15, 2011.
Anisha et al., "Strain engineered Si/SiGe resonant interband tunneling diodes with outside barriers grown on Si0.8Ge0.2 virtual substrates," Applied Physics Letters, No. 93, pp. 102113-1-102113-3, Sep. 2008.
Bessett et al., "High n-type Doping for Ge-on-Si light emitters," OSA Integrated Photonic Research (IPR), Silicon and Nanophotonics 2011, Photonic Integration (ITuC5), OSA/ANIC/IPR/Sensors/SL/SOF/SPPCom/2011, Toronto, CA, slides pp. 1-12, presented Jun. 14, 2011.
Bruno et al., "Mechanism of B diffusion in crystalline Ge under proton irradiation," Physical Review B, No. 80 pp. 033204-1-033204-5, Jul. 2009.
Cai et al., "High phosphorous doped germanium: Dopant diffusion and modeling," Journal of Applied Physics, No. 112, pp. 034509-1-034509-5, Aug. 2012.
Camacho-Aguilera et al., "An electrically pumped germanium laser," Optics Express, vol. 20, No. 10, pp. 11316-11320, May 2012.
Camacho-Aguilera et al., "High active carrier concentration in n-type, thin film Ge using delta-doping," Optical Materials Express, vol. 2, No. 11, pp. 1462-1469, Sep. 2012.
Chen et al., "Epitaxial Growth of Germanium on Silicon for Light Emitters," International Journal of Photoenergy, vol. 2012, Article ID 768605, pp. 1-8, Jan. 2012.
Chen et al., "General expression for effective diffusivity of foreign atoms migrating via a fast intermediate," Journal of Applied Physics, No. 107, pp. 026101-1-026101-3, Jan. 2010.
Eisele, "Delta-type doping profiles in silicon," Applied Surface Science, No. 36, pp. 39-51, 1989.
Gavelle et al., "Detailed investigation of Ge-Si interdiffusion in the full range of Sit-xGex(0<=x,=1) composition," pp. 113524-1-113524-7, Dec. 2008.
Goh et al., "Enhancing electron transport in Si:P. delta-doped devices by rapid thermal anneal," Applied Physics Letters, vol. 93, pp. 142105-1-142105-3, Oct. 2008.
Kim et al., "Improved germanium n+/p junction diodes formed by coimplantation of antimony and phosphorus," Applied Physics Letters, vol. 98, pp. 082112-1-082112-3, Feb. 2011.
Lee et al., "Dopant Activation in Single-Crystalline Germanium by Low-Temperature Microwave Annealing," IEEE Electron Device Letts., vol. 32, No. 2, pp. 194-196, Feb. 2011.
Li et al., "Enhanced photoluminescence of strained Ge with delta-doping SiGe layer on silicon and silicon-on-insulator," Applied Physics Letters, vol. 95, pp. 251102-1-251102-3, Dec. 2009.
Oberbeck et al., "Encapsulation of phosphorus dopants in silicon for the fabrication of a quantum computer," Applied Physics Letters, vol. 81, No. 17, pp. 3197-3199, Oct. 2002.
Olesinski et al., "The Ge-P (Germanium-Phosphorus) System," Bulletin of Alloy Phase Diagrams, vol. 6, No. 3, pp. 262-266, 1985.
Pankratov, "Redistribution of Dopant During Overgrowth of Delta-Layer," NANO: Brief Reports and Reviews, vol. 1, No. 4, pp. 239-252, 2009.
Scappucci et al.," Ultradense phophorus in germanium delta-doped layers," Applied Physics Letters, vol. 94, pp. 162106-1-162106-3, Apr. 2009.
Scappucci et al., "Phosphorus atomic layer doping of germanium by the stacking of multiple delta layers," Nanotechnology, vol. 22, pp. 375203-1-375203-5, Aug. 2011.
Scappucci et al., "INfluence of encapsulation temperature on Ge:P delta-doped layers," Physical Review B, No. 80, pp. 233202-1-233202-4, Dec. 2009.
Tillack et al., "Atomic Control of Doping during Si Based Epitaxial Layer Growth Processes," ECS Transactions, vol. 33, issue 6, pp. 603-614, Dec. 2009.

(56) References Cited

OTHER PUBLICATIONS

Yu et al., "Germanium in Situ Doped Epitaxial Growth on Si for High-Performance n+/p-Junction Diode," IEEE Electron Device Letters, vol. 30, No. 9, pp. 1002-1004, Sep. 2009.
European Patent Application No. 12713417.9-1552, Applicant Communication pp. 1-4, Preliminary claim amendments claims 1-19, dated Apr. 2014.
European Patent Application No. 12713417.9-1552, EPO Examiner Communication pp. 1-2, Examination sheets 1-5, dated Mar. 2015.
European Patent Application No. 12713417.9-1552, Applicant response to EPO Examiner Communication dated Mar. 2015, pp. 1-7, claim amendments pp. 1-5, dated Jun. 2015.
Japanese Patent Application No. 2014-514454, corresponding to PCT/US2012/27350, Preliminary Amended Claims 1-10, dated Mar. 2014.
Japanese Patent Application No. 2014-514454, Report of JPO Office Action, pp. 1-6, dated Mar. 2015.
Japanese Patent Application No. 2014-514454, Claim amendments in response to JPO Office Action dated Mar. 2015, clean and marked-up listings of claims pp. 1-4, May 2015.
Japanese Patent Application No. 2014-514454, Report of JPO Office Action, pp. 1-6, dated Dec. 2015.
Japanese Patent Application No. 2014-514454, Response to JPO Office Action dated Dec. 2015, pp. 1-4, Jan. 2016.
Japanese Patent Application No. 2014-514454, Report of JPO Office Action, pp. 1-9, dated Aug. 2016.
Japanese Patent Application No. 2014-514454, Response to JPO Office Action dated Aug. 2016, Nov. 2016.
European Patent Application No. 12713417.9-1552, EPO Examiner Communication, pp. 1-2, Examination sheets 1-4, dated Jan. 2017.
European Patent Application No. 12713417.9-1552, Applicant response to EPO Examiner Communication dated Jan. 2017, pp. 1-3, claim amendments pp. 1-4, dated Apr. 2017.

* cited by examiner

US 10,680,413 B2

METHOD FOR HIGH-CONCENTRATION DOPING OF GERMANIUM WITH PHOSPHOROUS

CROSS-REFERENCE TO RELATED APPLICATIONS

This application is a divisional of application Ser. No. 14/124,004, filed May Dec. 5, 2013, which is the National Stage of International Application No. PCT/US12/27350, filed Mar. 1, 2012, which claims the benefit of U.S. Provisional Application No. 61/495,455, filed Jun. 10, 2011, the entirety of all of which is hereby incorporated by reference.

STATEMENT REGARDING FEDERALLY SPONSORED RESEARCH

This invention was made with Government support under Contract No. N00421-03-9-002, awarded by the Naval Air Warfare Center-Aircraft Division, and under Contract No. FA9550-06-1-0470, awarded by the Air Force Office of Scientific Research. The Government has certain rights in the invention.

BACKGROUND

This invention relates generally to techniques for electrically doping semiconducting materials, and more particularly relates to high-concentration doping of semiconducting materials in the fabrication of semiconductor devices.

High-concentration electrical doping of semiconducting materials is becoming increasingly important for enabling advanced-performance electronic and optoelectronic devices. Conventionally, one or more electrical dopants can be added to a semiconducting material by, e.g., in situ incorporation of a dopant during semiconducting material growth, by ion implantation into an existing semiconducting material, or by solid- or vapor-phase diffusion of a dopant into an existing semiconducting material, among a wide range of other doping methods.

Whatever doping technique is employed, the dopant species that is incorporated into a semiconducting material must be electrically activated. That is to say that the dopant species must be positioned at sites in the semiconductor material lattice such that free electrical carriers, i.e., holes or electrons, are contributed to the semiconductor conductivity by the dopant species to alter the conductivity of the semiconducting material in a desired manner.

But the concentration of dopant that is active in a semiconducting material can be much less than the dopant concentration that is actually physically present in the material. Generally, defects in a semiconducting material, e.g., damage that is generated by the doping process itself, can limit the activation of dopants. In general, high-temperature annealing has been shown to both enhance dopant activation and reduce lattice defects. But the temperature that is required for a very high degree of dopant activation by annealing is for many applications too aggressive for integration into advanced semiconductor fabrication sequences with nanometric device features. High temperature annealing processes also can cause a degree of dopant diffusion that is sufficiently high to actually drive the dopant species out of the semiconductor material.

As a result, it is found that for many semiconducting materials, there is some limit of activated dopant concentration beyond which most conventional doping processes fail. For example, ion implantation enables full control of dopant location, including directionality, but for many materials causes severe lattice damage that in general results in a low fraction of activated dopant even when high a high concentration of dopant is physically present. In situ doping during material growth produces relatively minimal lattice damage, but for many materials, high in situ doping can reduce or even halt material growth by, e.g., surface poisoning. The resulting upper limit for in situ doping concentration that can be accommodated during material growth may actually be far below the solid-solubility of the dopant species in the semiconductor material. Solid phase diffusion is limited by the diffusivity characteristics of a given semiconductor material, and vapor-phase diffusion processes typically require a temperature that cannot be tolerated in nano-scale device fabrication with many materials.

For a wide range of important semiconducting materials, high-concentration active doping has therefore remained difficult, and is in general impossible in the context of conventional high-throughput silicon-based fabrication processes and equipment.

SUMMARY OF THE INVENTION

There are herein provided methods for electrically doping semiconducting materials for achieving a high concentration of activated dopant in the semiconducting materials. These methods can be employed in a wide range of applications, including, e.g., the production of photonic devices, and structures for producing such photonic devices, that enable high-performance opto-electronic device operation.

In one method for electrically doping a semiconducting material, a layer of germanium is formed having a germanium layer thickness, while in situ incorporating phosphorus dopant atoms at a concentration of at least about $5 \times 10^{18}$ $cm^{-3}$ through the thickness of the germanium layer during formation of the germanium layer. Additional phosphorus dopant atoms are ex situ incorporated through the thickness of the germanium layer, after formation of the germanium layer, to produce through the germanium layer thickness a total phosphorus dopant concentration of at least about $2 \times 10^{19}$ $cm^{-3}$.

With these methods and the structures produced by such, there are enabled a wide range of high-performance opto-electronic devices and systems having operational parameters that previously could not be attained. Further features and advantages will be apparent from the following description and accompanying figures, and from the claims.

DETAILED DESCRIPTION

Figure 1:
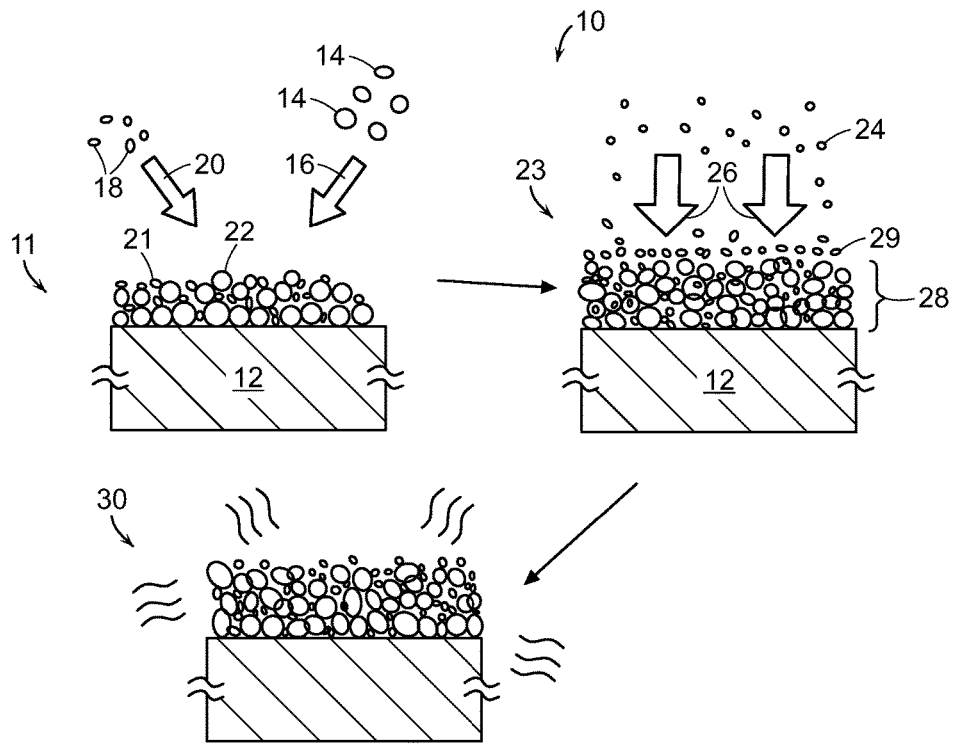
FIG. 1 is a schematic depiction of the processing conducted in a two-step in situ-ex situ process for high-concentration activated doping of a semiconducting material.

Referring to FIG. 1, in a process 10 for doping a semiconducting material, a first in situ doping step 11 is conducted. The term "in situ doping" refers herein to a process of incorporating dopant atoms into a semiconducting material during formation of the semiconducting material, e.g., during growth of a layer of the material. Subsequently, there is conducted a second, ex situ doping step 23 that is carried out on the semiconducting material after its formation. The term "ex situ doping" therefore refers herein to a process of incorporating dopant atoms into a semiconducting material, e.g., a layer of semiconducting material, which has been previously formed. As explained in detail below, it is discovered that the in situ and ex situ doping processes operate synergistically to achieve a level of activated dopant concentration that is not achievable with either doping step alone, while preserving the electrical and mechanical integrity of the semiconducting material.

The semiconducting material to be doped can be formed on a substrate 12, as shown in FIG. 1, which is provided with any desired composition and structure. The substrate can be an electrically doped material or an intrinsic material, and can be formed of the semiconducting material itself or another desired composition. The semiconducting material can be formed on one or more layers that have been previously disposed on the substrate, and such layers can be homogeneous or heterogeneous with the underlying substrate and the semiconductor material to be formed.

As shown in FIG. 1, during the in situ doping step 11, there is provided such a substrate 12 to which one or more species 14 for forming the semiconducting material are directed 16. The semiconducting material formation process can be conducted as a vapor-phase process, liquid-phase process, or other suitable technique. Examples of well-suited vapor-phase material growth techniques include Chemical Vapor Deposition (CVD), Atomic Layer Deposition (ALD), Molecular Beam Epitaxy (MBE), and sputter deposition, among a wide range of suitable processes.

During the formation of the semiconducting material, one or more species 18 for incorporating dopant atoms into the semiconducting material are directed 20 to the substrate 12 along with the species for forming the semiconducting material. As a result, as the semiconducting material is formed, dopant atoms 21 and semiconducting material atoms 22 are produced on the substrate 12, such that dopant atoms are incorporated into the semiconducting material lattice through its thickness as, e.g., a layer of the material is formed.

The in situ doping step is conducted under selected conditions, as explained in detail below, that produce a desired concentration of dopant atoms in the semiconductor material as-grown, herein termed the background doping level or background electrical carrier concentration. In general, this in situ-produced background doping level can be selected ideally for a given application. For any application, this background doping level provides an electrical carrier concentration that is greater than the electrical carrier concentration of the intrinsic semiconducting material at a corresponding diffusion temperature; that is, the carrier concentration provided by the background doping is greater than the intrinsic carrier concentration of the semiconducting material.

With a desired in situ background doping step complete, then, as shown in FIG. 1, the ex situ doping step 23 is conducted to further electrically dope the semiconducting material, now from an external source. In this step, one or more species 24 are directed 26 to the formed semiconducting material 28 with its background doping concentration, to add additional dopant atoms to the background doping concentration. For example, a solid layer 29 of dopant atoms can be formed on the surface of the semiconducting material. Alternatively, dopant atoms can be introduced into the semiconducting material surface to some selected depth within the semiconducting material. The dopant species 24 can be the same as that employed in the in situ doping step, or can be different, and can include multiple dopant species as-desired. The dopant species in this ex situ dopant step are therefore provided as a dopant reservoir either at the surface of the material or within the material itself. Then the dopant from the reservoir is diffused 30 through the bulk of the material by, e.g., a suitable thermal process as shown in FIG. 1.

This thermal process 30 causes the dopant species to diffuse through the semiconducting material and thereby activates the dopant species through the bulk of the material. Thermal annealing or other process can be employed here to a degree desired for a given application, to enable contribution of holes or electrons by the dopant atoms to the semiconducting material from the dopant reservoir. As explained in detail below, the parameters of such a dopant activation treatment must be considered within the constraints of a given fabrication sequence.

This ex situ doping process of dopant reservoir formation 23 and then diffusion 30 can be carried out employing, e.g., a solid source of dopant, a vapor source of dopant, or a liquid source of dopant, and further can employ ion implantation, plasma doping, or other selected process, that provides dopant species which can diffuse through the semiconducting material layer.

With this combination of in situ and ex situ doping steps, the background carrier concentration that is produced in a semiconducting material by the in situ doping step is found to enhance the ex situ dopant diffusion process while minimizing damage to the semiconducting material. As a result, a high-concentration of activated dopant, with an electrical carrier concentration that is inaccessible by the in situ step alone or by the ex situ step alone, can be incorporated into the semiconducting material. The only physical limit to the achievable doping level may be dopant precipitation under some conditions, but in general, because the process is not in equilibrium, the solid solubility of a dopant in the semiconducting material can be surpassed.

Specifically, the dopant atoms that are incorporated through the bulk of the semiconducting material by the in situ doping step operate to significantly enhance the diffusivity that is characteristic of the semiconducting material. The diffusion of dopant atoms into the semiconducting material during the ex situ doping step is thereby accordingly significantly enhanced, and can overcome many competing processes that tend to reduce the ultimate doping concentration that can be achieved. The diffusion of dopant atoms during the ex situ doping step is further enhanced by the preservation of the integrity of the semiconducting material lattice during the in situ doping step. Relatively minimal crystal lattice damage occurs during the in situ doping step, and the resulting high degree of lattice integrity aids dopant diffusion during the ex situ doping step. If the ex situ doping process is one that also minimizes lattice damage and the incorporation of lattice defects, then dopant diffusion during the ex situ doping step can be further enhanced and a very high concentration of doping can be achieved.

Figures 2A, 2B, 2C:
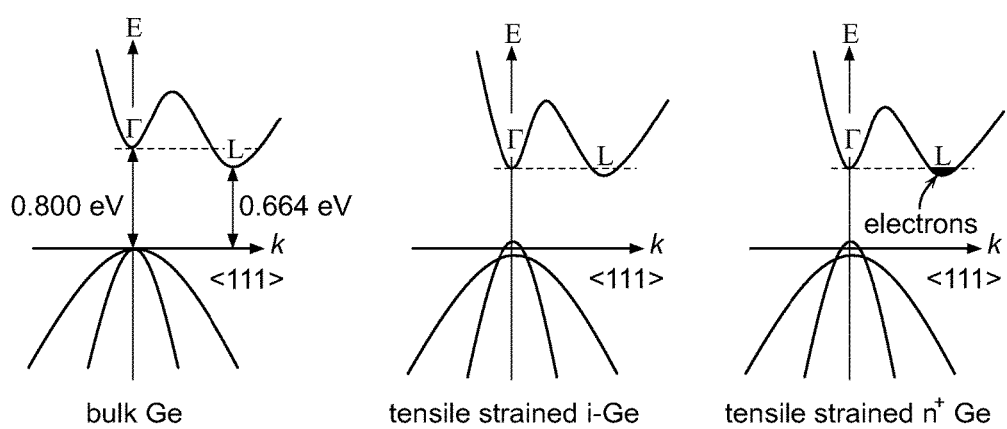
FIGS. 2A, 2B, and 2C are plots of the conduction and valence bands at the band gap of bulk intrinsic Ge, tensile-strained intrinsic Ge, and tensile strained n$^+$ doped Ge, respectively.

One example semiconducting material for which this high-concentration doping process is particularly desirable is germanium. Germanium (Ge) is intrinsically an indirect bandgap semiconducting material but can be engineered as a pseudo-direct bandgap material. As shown in FIG. 2A, intrinsic bulk Ge is characterized by a direct energy band gap of 0.8 eV, which corresponds to a wavelength of 1550 nm, the most widely-used wavelength in optical communication. The energy difference between this direct band gap, at the Γ valley of the conduction band, and the smaller, indirect band gap, at the L valley of the conduction band, is about 0.136 eV. To enable direct band gap transitions at the desired wavelength of 1550 nm, energies of these conduction band valleys must be aligned.

It is found that when intrinsic Ge is subjected to mechanical tensile strain, the Ge energy bands are correspondingly shifted, as shown in FIG. 2B. Under tensile strain, the energy difference between the Γ valley of the conduction band and the L valley of the conduction band is reduced to about 0.11 eV, under tensile strain of between about 0.1% and about 0.3%. Such tensile strain can be imposed by, e.g., growth of Ge on a substrate material, e.g., silicon, that is characterized by a crystal structure that is correspondingly mismatched with that the Ge. Examples of such methods are described in "Method of Forming Ge Photodetectors," U.S. Pat. No. 6,946,318, issued Sep. 20, 2005, the entirety of which is hereby incorporated by reference. With the imposition of a condition of 0.25% tensile strain, then as shown in FIG. 2C, an $n^+$ doping concentration that provides about $4\times10^{19}$ cm$^{-3}$ electrons can fill the L valley to enable the desired 0.76 eV band gap for 1550 nm wavelength transitions.

Conventional in-situ n-type doping of Ge by CVD epitaxial processing is found to produce an active carrier concentration of only about $10^{19}$ cm$^{-3}$, due to a delicate balance between dopant incorporation and dopant out-diffusion during Ge growth. Epitaxial growth at relatively lower temperatures is understood to enable an increase in dopant incorporation, but in general can result in such a poor quality Ge layer that only a small fraction of the incorporated dopant is activated. Molecular Beam Epitaxy (MBE) has been shown to enable activated n-type dopant concentrations of about $10^{20}$ cm$^{-3}$, but MBE is an impractical process for many fabrication sequences in that conventional CMOS fabrication processing does not employ MBE. As a result, conventional silicon-based devices and structures cannot be monolithically integrated with MBE materials. Ion implantation has been demonstrated to achieve a high concentration of activate dopant in Ge after rapid thermal annealing, but at a high implant dose the resulting implant damage is difficult to remove and increases the optical loss in optical devices formed of such implanted Ge. Long-duration furnace annealing is shown to remove such implantation damage but due to out-diffusion of dopant species during the anneal, results in significantly reduced doping concentration.

The two-step, in situ-ex situ doping process overcomes these limitations to achieve a Ge doping level that enables practical implementation of Ge as a laser material for optoelectronic systems. Considering phosphorus (P) doping of Ge, it is found that the in-situ doping step can produce a carrier concentration of $1\times10^{19}$ cm$^{-3}$ with P doping, and that diffusion of phosphorus from a dopant reservoir during the ex situ doping step is in the extrinsic doping region with a quadratic dependence on carrier concentration.

In analyzing the two-step in-situ-ex situ doping method for phosphorus doping of Ge, it is found that theoretical calculations predict that because the vacancy formation energy in Ge of 2 eV is significantly lower than that in Si, at 3.5 eV, vacancies play a more important role in Ge than in Si in dopant diffusion. Ge self-diffuses by a vacancy mechanism in which vacancies act as acceptors. N-type dopants, such as P, As, and Sb, have higher diffusivity in Ge than the diffusivity of Ge self-diffusion. This fact reveals that an attractive interaction between n-type dopants and Ge vacancies results in the formation of dopant-vacancy pairs (DV$^-$) during dopant diffusion through Ge. It is therefore, reasonable to impose a vacancy mechanism on the modeling of P dopant diffusion in Ge.

The charge state of a lattice vacancy in Ge is assumed to be doubly negative. The extrinsic, doubly charged Ge diffusivity, $D_{(DV)^-}$, can therefore be considered to depend quadratically on electrical carrier concentration, and can be expressed as:

$$D_{(DV)^-} = D_0 \left(\frac{n}{n_i}\right)^2, \quad (1)$$

where $D_0$ is the intrinsic diffusivity of Ge; n is the equilibrium carrier concentration in a given Ge sample and $n_i$ is the intrinsic carrier concentration in tensile-strained Ge at the dopant diffusion temperature of the ex situ doping step.

Given a 0.25% tensile strain in the Ge, then the resulting reduction in the bandgap and the splitting of the valence bands causes the intrinsic carrier concentration, $n_i$, in tensile-strained Ge to be given as:

$$n_i = \sqrt{N_c\left(N_{lh} + N_{hh}\exp\left(\frac{-\Delta E}{kT}\right)\right)} \exp\left(-\frac{E_g}{2kT}\right), \quad (2)$$

where $N_c$ is the effective density of states of electrons in the conduction band, $N_{lh}$ is the effective density of states of light holes in the valence band, $N_{hh}$ is the effective density of states of heavy holes in the valence band, and $\Delta E$ is the splitting energy of light and heavy holes at the $\Gamma$ valley.

With this intrinsic concentration thusly specified, then phosphorus dopant diffusion in Ge during the ex situ doping step can be described by Fick's second law as:

$$\frac{\partial n(x)}{\partial t} = \frac{\partial}{\partial x}\left(D_{(DV)} - (n)\frac{\partial n}{\partial x}\right). \quad (3)$$

With this analysis, it is shown that the extrinsic diffusivity of in situ-doped Ge is significantly increased over that of intrinsic Ge because of the quadratic dependence of the diffusivity on carrier concentration. The phosphorus diffusion is correspondingly enhanced by the in situ doping. As a result, the rate of diffusion of phosphorus through the in situ-doped Ge is found to be significantly enhanced over the rate of phosphorus diffusion through intrinsic Ge. This enhanced rate of diffusion overcomes the loss of dopant that generally occurs during a diffusion step due to out-diffusion at the surface and interfaces, and due to loss of dopant by interface defect trapping. Thus, by exploiting the diffusivity enhancement that results from the in situ doping step, the ex situ doping step is correspondingly enhanced. As a result, it is discovered that a level of doping concentration heretofore unachievable can be attained by the two-step in situ-ex situ doping method. With this achievement, the resulting highly-doped germanium can be incorporated with silicon electronics to produce monolithic optoelectronic systems operating at a wavelength of 1550 nm.

Figure 3A:
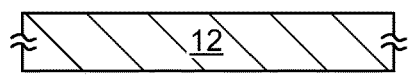
FIGS. 3A-3G are schematic cross-sectional views of an example two-step in situ-ex situ doping process for high concentration activated doping of a Ge active layer, including an ex situ doping process employing delta dopant reservoir layers.

In one example for applying this two step doping method to Ge, to attain an active device layer with a doping level higher than that achievable by conventional in situ doping during growth of a Ge layer, there is grown on a selected substrate a layer of Ge for which a high carrier concentration is desired. Referring to FIG. 3A, the substrate 12 can be provided as any suitable material; for many applications it can be preferred to select a material with a lattice structure that is similar to Ge or Si and that imposes a selected degree of mechanical strain on Ge, to adjust the conduction band valleys in the manner described above. A suitable II-VI or III-V substrate can be employed for many applications. Silicon or quartz can be a preferred substrate material for many applications. The substrate can be doped with a suitable dopant species and concentration as-required for a given device application, as explained in detail below.

In the conventional manner, the growth can be carried out on a bare substrate or on a substrate including, e.g., a patterned layer that limits the extent of Ge growth for forming Ge mesas, as explained in detail below. For example, there can be provided a patterned layer of silicon dioxide including windows through which Ge growth can be conducted to laterally restrict the Ge growth. Such patterned growth can be tailored for a given application, as described in detail below.

Figure 3B:
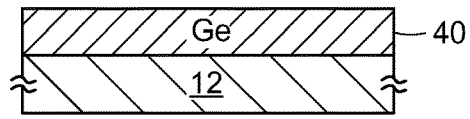

Referring to FIG. 3B, for many applications, it can be preferred to form a first Ge buffer layer 40, or strain layer, on the substrate 12 prior to formation of an active Ge layer. The buffer layer relaxes the strain induced by lattice mismatch with the substrate to a reasonable level, and further serves as a sink for dislocations. The buffer layer can be provided as any suitable thickness, e.g., between about 15 nm and about 80 nm, and can be doped or undoped, as-required for a given application. Under some processing conditions, the buffer layer can preferably be provided with a thickness between about 25 nm and about 80 nm. An active Ge layer can then be formed on the buffer layer with any suitable thickness for a given application.

Any suitable growth process can be employed, including ALD, MBE, and CVD, such as ultra-high vacuum CVD (UHVCVD). An UHVCVD process will be described here by way of example, but such is not limiting.

In one such example process, in which Ge is formed on a silicon substrate, UHVCVD is conducted, at pressures less than about $1\times10^{-9}$ torr, to produce the Ge layer or layers on the substrate. The deposition chamber temperature is first set to, e.g., about 720° C., with hydrogen flowing to remove from the silicon surface any native oxide after conventional cleaning of the substrate, to further clean the silicon surface, and to passivate the substrate surface area of growth. The hydrogen flow rate can be provided as, e.g., about 5.5 sccm, giving a chamber pressure of about $3.4\times10^{-4}$ mbar.

After a selected time for cleaning, e.g., about 20 min, the system temperature is decreased to a temperature for growth of the Ge buffer layer, e.g., a temperature between about 320° C. and about 500° C. Once stable at the selected buffer layer growth temperature, a germanium precursor gas, such as $GeH_4$, is delivered to substrate. For example, a buffer layer growth temperature of about 360° C. can be employed with a $GeH_4$ flow rate of about 7.5 sccm for about 60 min, with a chamber pressure of about $8\times10^{-4}$ mbar, to produce a buffer layer.

It is recognized that the Ge buffer layer is not required in general and can be excluded from the Ge layer growth for suitable applications. For example, if a selected Ge growth process provides reduced strain, then the buffer layer, which includes dopant traps at which dopant atoms may segregate, can be eliminated. This can be an attractive technique where a very high doping level is desired. As a result, for a given process sequence and device application, if such a buffer layer is not desired, then this process step can be omitted.

Figure 3C:
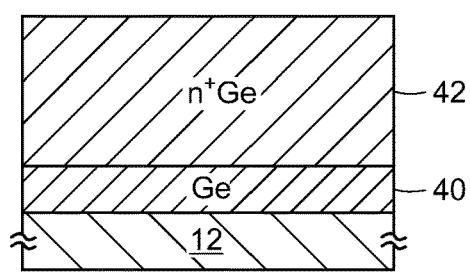

With the buffer layer in place on the silicon substrate, an active Ge layer 42 is then formed, referring to FIG. 3C. Maintaining the substrate in situ, the deposition chamber temperature is raised to a selected active layer deposition temperature, e.g., between about 500° C. and about 720° C., e.g., about 650° C. This Ge layer growth is conducted until a selected Ge active layer thickness is achieved, e.g., for about 120 min. During growth, the Ge precursor gas $GeH_4$ is flowed at a selected flow rate, e.g., about 3.5 sccm and if desired, a selected dopant gas is introduced to dope the Ge layer in situ during growth. For example, a gas of $PH_3$ can be introduced at a rate of, e.g., about 12 sccm, with a chamber pressure of $4\times10^{-4}$ mbar, to incorporate phosphorus atoms into the growing Ge layer in the manner described above. The dopant flow rate is selected based on the corresponding level of dopant incorporation that can be accommodated by the Ge layer and based on the dilution of the dopant the gas phase.

To achieve a high in situ doping level, it can be preferred for many applications to employ a ratio of Ge precursor gas flow and dopant precursor gas flow of between about 3:1 and about 4:1. For many applications it can be desired to produce with the in situ doping step a dopant concentration of at least about $5 \times 10^{18}$ cm$^{-3}$, and more preferably to produce an in situ doping concentration of at least about $1 \times 10^{19}$ at a reasonable Ge growth temperature, e.g., 650° C. Achievement of a higher in situ doping concentration is limited by a balance between P out-diffusion and Ge crystal quality. Ge crystallinity degrades at growth temperatures below about 600° C. while P significantly out-diffuses at temperatures about 650° C. Due to the small growth window that is thusly defined, the achievable in situ P doping concentration is limited. UHVCVD growth at a temperature of about 650° C. can therefore be preferred for doping with P for many applications.

With the active Ge layer and any underlying buffer layer produced, the first step of the doping process, namely, the in situ step, is complete. The resulting doping concentration of the active Ge layer is termed the background in situ doping level, and is the concentration that will be enhanced by the second, ex situ, doping step.

Referring again to FIG. 1, the ex situ doping process 23 can be completed in any suitable manner for adding to the active layer the dopant to be diffused into the active layer. No particular technique is required for providing a dopant reservoir to be diffused into the active layer. In one example, as shown in FIG. 1, there can be provided a solid diffusion source 29 on top of the Ge active layer. In the Ge example given here, a reservoir of phosphorus atoms can be provided on the Ge active layer surface for diffusion into the layer. But any suitable process can be employed for forming the solid diffusion source and as explained above, ion implantation or other suitable process can alternatively be employed to provide a source of dopant at the Ge active layer, as described in detail below.

Considering first the formation of a solid diffusion source, or dopant reservoir, formed on the active layer, phosphorus atoms can be provided by CVD, ALD, MBE, or other suitable process, to form several monolayers, a single monolayer, or a fraction of a monolayer of phosphorus dopant atom coverage on the Ge active layer surface, producing a so-called delta doping layer.

In one example of this step, immediately after formation of the Ge active layer and buffer layer by UHVCVD, the CVD chamber temperature is decreased from the Ge active layer growth temperature to a temperature of between, e.g., about 360° C. and about 450° C., e.g., about 400° C. A 5.5 sccm flow rate of $H_2$ is continued for a selected duration to stabilize the temperature and then a phosphorus precursor, e.g., $PH_3$ is introduced at a flow rate of, e.g., about 12 sccm for a duration suitable to provide a selected coverage of phosphorus atoms, e.g., between about 5-10 min.

Figure 3D:
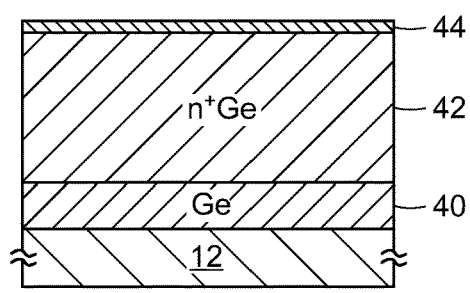

The flow rate is preferably selected to achieve a high level of dopant atoms on the Ge layer surface. Referring to FIG. 3D, this results in a dopant layer 44 on top of the active Ge layer 42. The dopant layer 44 can be a monolayer, partial monolayer, or multiple layers of atoms.

Figure 3E:
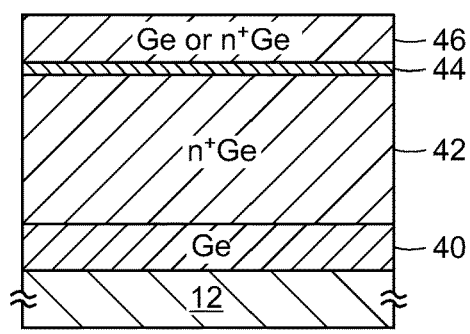

Once the layer 44 of phosphorus atoms is produced, the layer is immediately capped with an encapsulating layer of Ge 46, as shown in FIG. 3E. The function of the encapsulating layer is to maintain the layer of delta doping phosphorus atoms in place and if desired, to provide a surface for the deposition of additional phosphorus atoms. The Ge encapsulating layer can be any suitable thickness, e.g., between about 1 nm and about 20 nm as a minimum thickness, and can be provided as a fraction of a monolayer, a monolayer, or several monolayers of Ge. The Ge encapsulation layer can be doped or undoped.

The Ge layer can be formed by continuing the CVD sequence by, e.g., flowing GeH$_4$ at a flow rate of, e.g., about 3 sccm for a selected duration, e.g., 10 min. The temperature can be adjusted or can be maintained at the dopant deposition temperature. For many applications it can be preferred to maintain the temperature at the dopant deposition temperature. It is preferred that the phosphorus dopant and Ge encapsulation layers be deposited at relatively low temperatures at which the solid solubility of the Ge and P is increased.

Figure 3F:
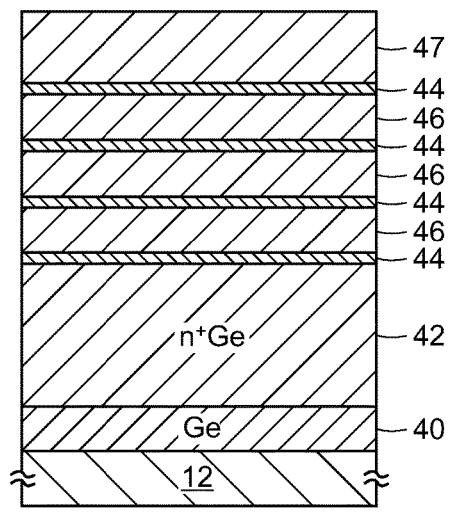

Referring back to FIG. 1, subsequent to dopant reservoir formation, the dopant is caused to diffuse 30 into the active Ge layer to enhance the in situ doping level. Therefore, more than one delta doping layer can be included, if desired, to provide sufficient dopant atoms for achieving a selected doping level of the Ge active layer by the subsequent diffusion step. Thus, any suitable number of dopant and encapsulating layers can be included, e.g., at least about three, and even eight or more. FIG. 3F illustrates an example of this condition, with four doping layers 44 provided, separated by encapsulation layers of Ge 46.

Figure 4:
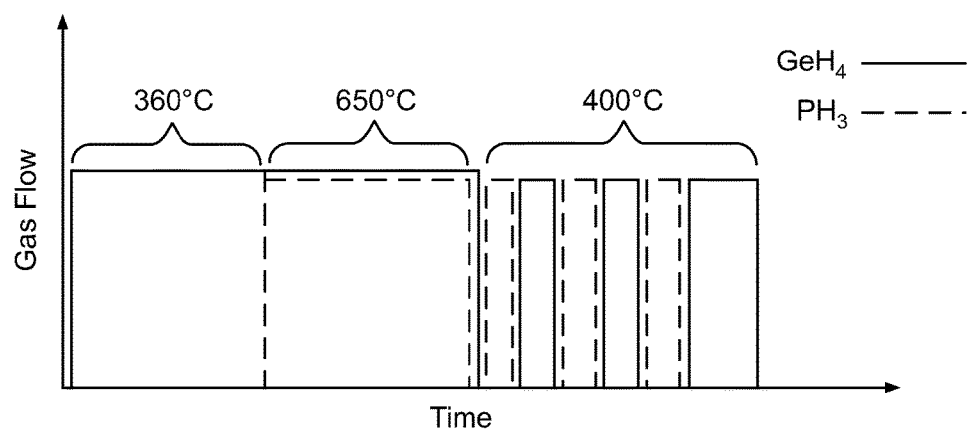
FIG. 4 is a plot of gas flow as a function of time for the two-step doping process depicted in FIGS. 3A-3F.

FIG. 4 is a plot of an example gas flow control scenario for conducting this Ge layer growth and delta doping layer formation all within a single CVD sequence. At a first buffer layer growth temperature, e.g., 360° C., GeH$_4$ is flowed to produce an undoped Ge buffer layer, then at a selected active layer growth temperature, e.g., 650° C., GeH$_4$ and PH$_3$ are flowed to form a Ge active layer that is in situ doped with phosphorus. Thereafter, an alternating sequence of GeH$_4$ and PH$_3$ are flowed to form delta doping phosphorus layers separated by Ge encapsulation layers. This example process can be modified to dope the Ge encapsulation layers by maintaining the flow of GeH$_4$ both during delta doping layer formation and during encapsulation layer formation.

Once a selected number of phosphorus doping layers and encapsulating layers are provided, a thicker germanium layer 47, shown in FIG. 3F, can be provided as a capping layer, by, e.g., a Ge growth step of about 20-30 min in duration in the manner described above. This capping layer protects the surface from oxidation and contamination, and further prevents out-diffusion of dopant from the doping layers. An oxide, nitride, silicon, or other material capping layer can alternatively be employed to preserve the delta doping stack surface.

At this point, a thermal annealing process or other suitable method is carried out to cause the dopant atoms in the stack of delta dopant layers to diffuse into the germanium active layer to increase the active dopant concentration in the active layer. For many applications, a thermal annealing process can be preferred for its ability to repair crystal lattice damage that may exist in the active layer. To enable sufficient diffusion of dopant from the delta doping layers, an annealing temperature of at least about 500° C. can be preferred, and a maximum annealing temperature that is below the melting point of Ge, e.g., about 800° C., can be preferred.

For many applications, a rapid thermal anneal (RTA) process conducted at a temperature within this temperature range can be employed, for a duration of, e.g., between about 5 sec and about 5 min. For example, an RTA step for 3 min at 300° C. can be suitable, while an RTA step for 30 s at 700° C. can also be suitable. It is therefore to be recognized that empirical analysis is generally required to optimize the duration and temperature of the diffusion step. This step results in the uniform doping of the germanium active layer with the activated phosphorus atoms at a concentration above that produced by the in situ doping step. The stack of encapsulated dopant layers is thereby found to provide a capsule of solid source dopant that diffuses through the entire system during annealing to provide a high active dopant concentration throughout the active layer.

Figure 3G:
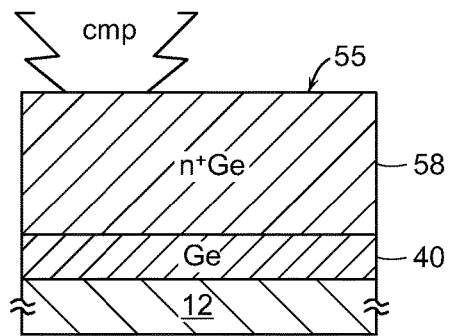

Referring to FIG. 3G, after diffusion of dopant from the delta doping layers into the Ge active layer, there can be conducted a chemo-mechanical polishing step (CMP) to remove the delta doped layers and the intermediate Ge encapsulation layers from the surface 55 of the Ge active layer. This results in an active layer 58 having the desired high-concentration activated dopant with all dopant source removed. With the completion of the CMP step, high-concentration activated doping of the Ge active layer is complete.

This example of a UHVCVD sequence for the in situ and ex situ doping process is not meant to be limiting; as explained above, other processes can be employed. For example, Ge buffer and active layers can be grown and in situ-doped by a CVD process, and then each delta doping layer formed by a suitable ALD or MBE process. Alternatively, Ge active layer growth and in situ doping, as well as delta doping layer formation, can be carried out all with MBE processes, or all with ALD processes. For many applications, a CVD process is particularly convenient because of its compatibility with conventional silicon CMOS processing. Integration with a conventional CMOS fabrication sequence and fabrication facility is correspondingly most convenient with a CVD process.

As explained above, for any process to be employed for the in situ doping step, any suitable ex situ doping process can be employed. It is not required that the ex situ doping be conducted by the same process as the in situ doping, and can be conducted with an entirely different process. In addition to the CVD, MBE, and ALD processes described above, in a further example of an ex situ doping step, the dopant species can be ion-implanted into the active Ge layer for subsequent diffusion into the bulk of the Ge layer.

Figure 5A:
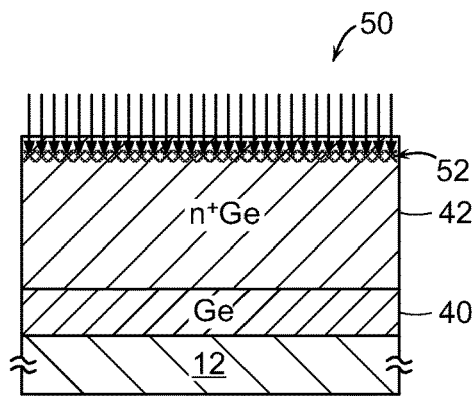
FIGS. 5A-5B are schematic cross-sectional views of an example ex situ doping process including ion implantation, to be employed subsequent to an in situ doping process for high-concentration activated doping of Ge.

Referring to FIG. 5A, in one example of this process, after in situ doping of a Ge layer during growth in the manner described above, dopant atoms are implanted 50 into the surface of the Ge active layer 42. One or more dopant species can be implanted into the Ge active layer. For example, phosphorus ions, arsenic (As) ions, and antimony (Sb) ions, or other suitable dopant ions, can be implanted alone or in combination into the surface of the Ge active layer. Suitable implantation parameters include an implantation energy between about 100 keV and about 400 keV, a dose of between about $3 \times 10^{15}$ $cm^{-2}$ and about $7 \times 10^{15}$ $cm^{-2}$, and a suitable tilt angle, e.g., about 7°.

As shown in FIG. 5A, the ion implantation process causes a layer of damage 52 at the surface of the active Ge layer 42, extending into the depth of the active Ge layer that corresponds to the energy and dose of the implantation. This damaged layer includes a high concentration of the implanted dopant and operates as a solid diffusion source, or reservoir of dopant, that can be diffused into the depth of the Ge active layer.

Following the ion implantation step, the structure is thermally annealed, in the manner described above, or subjected to an alternative suitable process, to diffuse the implanted dopant into the Ge active layer. RTA processing at a temperature between about 600° C. and about 800° C. for a duration of between about 30 s and about 1880 s can be preferably employed for many applications.

Figure 5B:
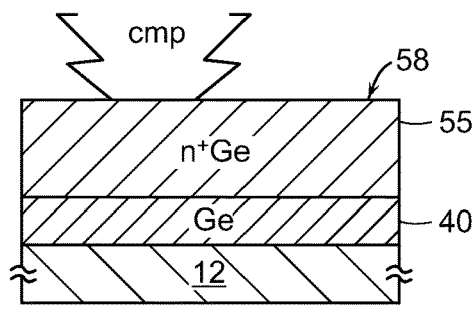

Referring to FIG. 5B, after diffusion of the implanted ions into the Ge active layer, there is conducted a chemo-mechanical polishing step (CMP) to remove the damaged region 52 from the surface of the Ge active layer. This results in a reduced-thickness active layer 55 having a polished surface 58 at which the crystal lattice damage from the ion implantation process is removed. With the completion of the CMP step, high-concentration activated doping of the Ge active layer is complete.

The ex situ doping step can be conducted with processes other than those described above and is not limited to ion implantation or delta dopant layer formation. Vapor-source diffusion, liquid-source diffusion, or other diffusion process can be employed to ex situ dope a semiconducting layer after in situ growth and doping of the layer.

With the high active dopant concentration enabled by the two-step in situ-ex situ doping process, optoelectronic devices can be fabricated to achieve operation that is enabled by the doping. Continuing with the example of high-concentration Ge doping, there can be produced. Ge lasers for operation in a silicon-based optoelectronic system employing such Ge lasers.

It has been estimated that an n-type doping level of $1 \times 10^{19}$ $cm^{-3}$ should yield a gain in a Ge Fabry-Perot cavity of about 50 $cm^{-1}$. This level of level gain can lead to lasing when pumped optically because optical losses are mainly limited to facet losses and free carrier losses in Ge. Conversely, for electrical pumping of such a cavity, additional losses due to the electrical contacts, free carrier losses in system materials such as doped polycrystalline Si, and losses due to interaction with the contact metal, must be overcome to enable lasing. Modeling of mode propagation in Ge waveguides with electrical contacts shows that these additional losses are $>100$ $cm^{-1}$.

To overcome these system losses, the Ge gain must be correspondingly increased, and such is attained by increasing the n-type doping concentration to a level of about $3-5 \times 10^{19}$ $cm^{-3}$. The in situ-ex situ doping process described above can achieve n-type doping levels of $>4 \times 10^{19}$ $cm^{-3}$ to meet this requirement. By correlation of photoluminescence (PL) intensity, n-type doping level, and measured material gain, it is determined herein that an n-type doping level of $4 \times 10^{19}$ $cm^{-3}$ corresponds to a Ge material gain of $>400$ $cm^{-1}$, which is sufficient to overcome the losses in an electrically pumped laser device, and thereby that enables a silicon-based Ge opto-electronic system.

Figure 6:
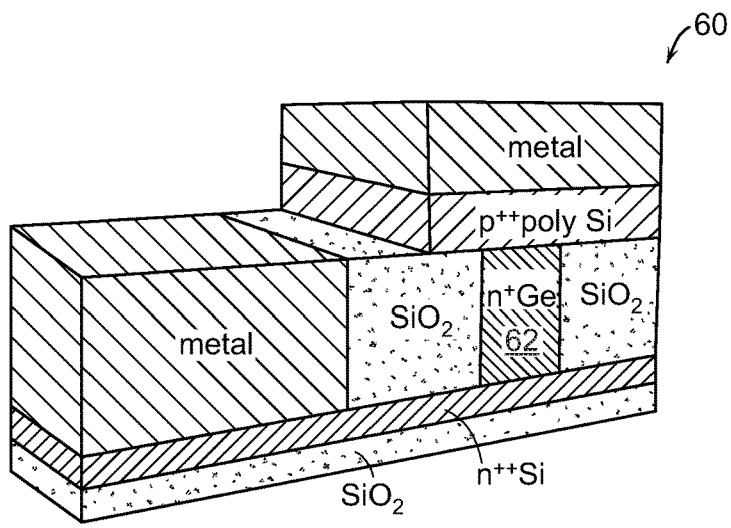
FIG. 6 is a schematic perspective view of an example design of the main body of a vertical-injection, electrically-pumped Ge laser that can be produced with the two step doping process of FIG. 1.
Figure 7A:
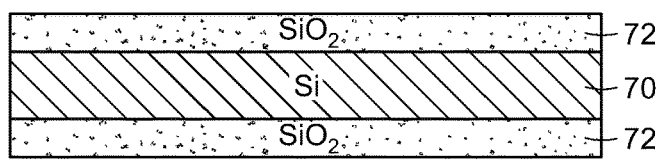
FIGS. 7A-7K are schematic cross sectional views of an example fabrication sequence for producing the main laser body of FIG. 6.

FIG. 6 is a perspective schematic view of an example of the main body of a vertical-injection Ge laser 60 including a Ge laser cavity 62 having a high-concentration active doping level that enables lasting with electrical pumping. Referring to FIG. 7A, in one example silicon-based process for fabricating the vertical-injection Ge laser body, there is provided a silicon substrate 70 having a selected doping level, e.g., about $1 \times 10^{19}$ $cm^{-3}$, that is sufficiently high for the substrate to operate as a contact electrode to the Ge laser cavity. The silicon substrate is oxidized, e.g., by thermal oxidation, to form a layer of silicon dioxide ($SiO_2$) 72 on both sides of the substrate, with an oxide thickness of e.g., between about 300 nm and about 500 nm.

Figure 7B:
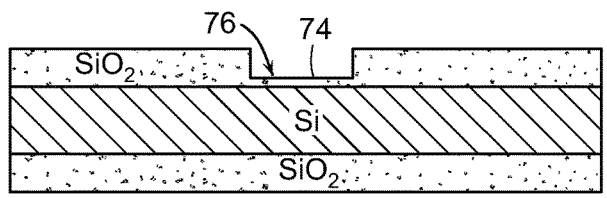
Figure 7C:
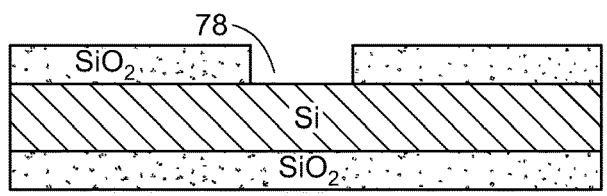

Referring to FIGS. 7B-7C, in a photolithographic step the top layer of silicon dioxide 70 is patterned and etched to define a trench 74 in the oxide layer, maintaining some thickness 76 of oxide at the bottom of the trench. This trench definition etch can be conducted by reactive ion etching (RIE) or other suitable process that preferably maintains vertical trench sidewalls in the oxide thickness. Then as shown in FIG. 7C a buffered oxide etch (BOE) wet etch can be employed to remove the oxide thickness 76 from the bottom of the trench while avoiding plasma damage to the surface of the silicon substrate at the location for Ge growth. A fully exposed window 78 in the oxide layer is thereby formed.

Figure 7D:
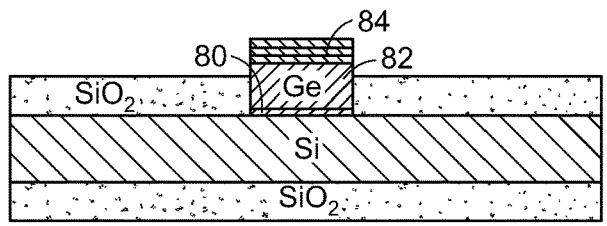
Figure 7E:
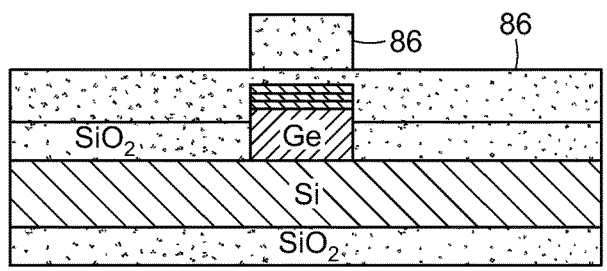
Figure 7F:
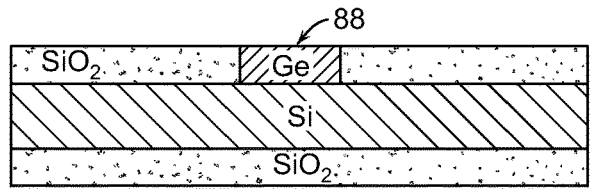

Referring to FIG. 7D, the in situ-ex situ doping process described above is then conducted with the growth of the Ge laser cavity material. In one example, there is grown on the silicon substrate in the oxide window a Ge buffer layer 80 of between about 20 nm and about 100 nm in thickness, an $n^+$ phosphorus-doped Ge active layer 82 of between about 300 nm and about 500 nm in thickness, and a stack 84 of phosphorus delta doping layers and Ge encapsulation layers also of between about 300 nm and about 500 nm in thickness, in the manner described above. Then as shown in FIG. 7E. there is formed by, e.g., plasma enhanced chemical vapor deposition (PECVD) a capping layer of silicon dioxide, of between about 300 nm and about 500 nm in thickness, or other suitable material, to protect the Ge and dopant layers. A thermal annealing step in the manner described above is then conducted to cause diffusion of dopant from the delta doping layers into the Ge active layer.

Alternatively, after growth and in situ doping of the active layer, there can be implanted into the Ge active layer 82 a dose of dopant ions sufficient for doping the active layer by diffusion from the implanted region at the surface, in the manner described above. A thermal annealing step is then conducted in the manner described above to cause diffusion of the implanted dopant ions from the surface of the Ge active layer into the bulk of the layer.

Whatever ex situ doping process is employed, at the completion of the annealing step or during a subsequent step, CMP or other planarizing process is employed in the manner described above to remove the delta doping and encapsulation layers, or to remove the ion-implanted damage surface region, to thereby expose the surface 88 of the Ge cavity active layer.

Figure 7G:
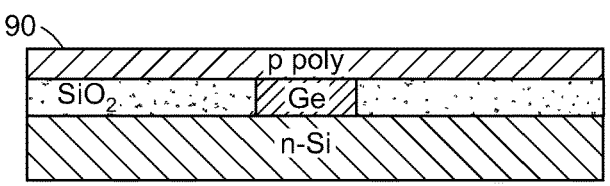

Referring to FIG. 7G, next there is formed the top contact to the Ge cavity. In one example process for such, there is deposited on the top surface of the structure a layer 90 of amorphous Si of about 200 nm in thickness. A low-temperature, long-duration annealing step is preferably employed to drive out $H_2$. In one example long-duration anneal, there is conducted a first, twelve-hour anneal at about 150° C.-200° C., a second, eight-hour anneal at about 200° C., a third, two-hour anneal at about 300° C., a fourth, two-hour anneal at 350° C., and a final, one-hour anneal at 400° C. Then the amorphous silicon is doped by, e.g., boron implantation, to form a p-doped layer of sufficient doping to operate as a contact electrode to the Ge laser cavity. At this point, the backside silicon dioxide layer is removed. Then using a suitable RTA process, e.g., at about 750° C. for about 1 minute, the implanted dopant is activated and the amorphous silicon is crystallized to polycrystalline silicon.

Figure 7H:
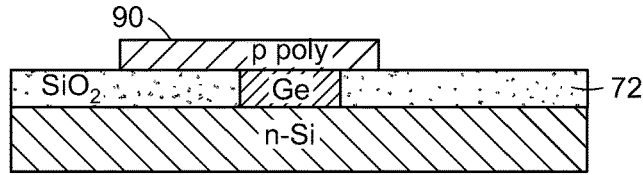
Figure 7I:
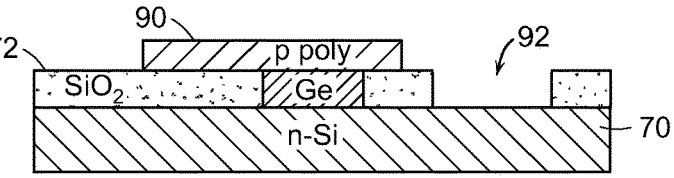

As shown in FIG. 7H, photolithography is conducted to pattern a layer of photoresist, and the p-doped polysilicon layer 90 is etched, e.g., by RIE, down to the underlying oxide layer 72, to define the upper electrode. Then as shown in FIG. 7I, photolithography is conducted to pattern a layer of photoresist, and the underlying oxide layer 72 is etched, e.g., by RIE, down to the silicon substrate 70 to define a window for making metal contact to the substrate, which operates as the lower electrode.

Figure 7J:
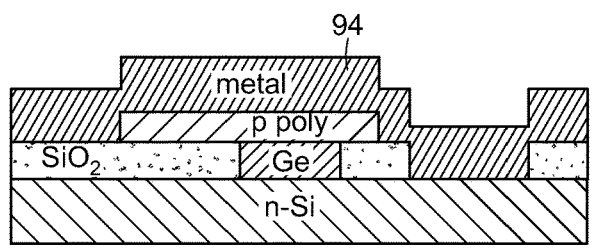
Figure 7K:
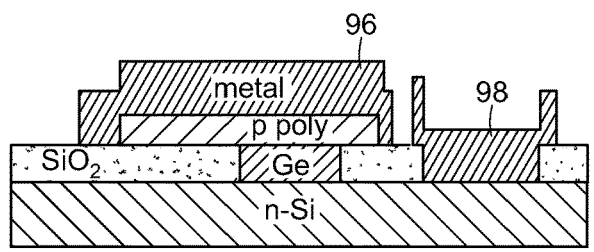

To complete the laser body structure, as shown in FIG. 7J, there is deposited a layer of a suitable metal for the metal contacts, e.g., a metal stack of Ti/TiN/Al, having corresponding thicknesses of about 100 nm, about 1 μm, and about 100 nm, respectively. As shown in FIG. 7K, the metal stack is lithographically patterned, e.g., by RIE, to define a top metal contact 96 to the upper p-type polysilicon layer and the bottom metal contact 98 to the lower n-type silicon substrate. With this step, the body of the Ge laser cavity and electrical connection to the cavity, is complete for a vertical-injection Ge laser. This fabrication sequence can be seamlessly integrated into a conventional CMOS fabrication process, and therefore processing to form corresponding Si electronics and other features and devices in the optoelectronic system can be conducted immediately following this process.

Electrically-pumped Ge laser cavity structures like that just described require both high doping concentration and a relatively thick, defect-free laser cavity material for successful operation of the laser system. The doping and laser fabrication processes described above provide both of these requirements, which have historically been difficult to achieve. The uniformity of the high-concentration doping that is provided through the thickness of the Ge active layer is particularly important for enabling laser fabrication. The ability to achieve this condition with use of CMOS-compatible fabrication processes and equipment enables integration of these processes and the resulting devices with silicon-based CMOS fabrication sequences in high-volume processing operations.

EXAMPLE 1

Ge In Situ Doping and Ex Situ Doping With Delta Dopant Layers

Ge layers were epitaxially grown on 6" Si (100) substrates using a hot-wall UHVCVD reactor. A 30 nm-thick Ge buffer layer was first directly grown on the Si substrates at a temperature of 360° C. Then a 300 nm-thick Ge layer with in situ doping of phosphorous at a doping level of $1 \times 10^{19}$ $cm^{-3}$ was grown at an elevated temperature of 650° C. with gas flow of 3.8 sccm of $GeH_4$ and 12 sccm $PH_3$. For comparison, there was also grown a 300 nm-thick Ge layer that was not in situ-doped during the Ge growth.

The substrates were then exposed to $PH_3$ gas flow of 12 sccm at 400° C. for 5 min to deposit a layer of P atoms onto the Ge surface while at the same time desorbing hydrogen. Subsequently, a 60 nm-thick intrinsic Ge layer was deposited at 400° C. Several cycles of $PH_3$ saturation and intrinsic Ge growth were performed in the reactor to encapsulate multiple layers of P dopant atoms. For several samples, four encapsulated dopant layers were formed, while for several other samples, eight encapsulated dopant layers were formed. A layer of 100 nm-thick $SiO_2$ was then deposited on the top Ge encapsulation layer as a capping layer to prevent out-diffusion during a subsequent annealing. The layers were then annealed by RTA at temperatures ranging from 600° C. to 750° C. and a range of annealing times.

Secondary ion mass spectroscopy (SIMS) measurements were performed on the as-grown and annealed samples to determine the diffusion profiles of the P dopant before and after the annealing steps. The P dopant depth profiles were recorded as a function of depth with an accuracy of 2 nm.

Figure 8:
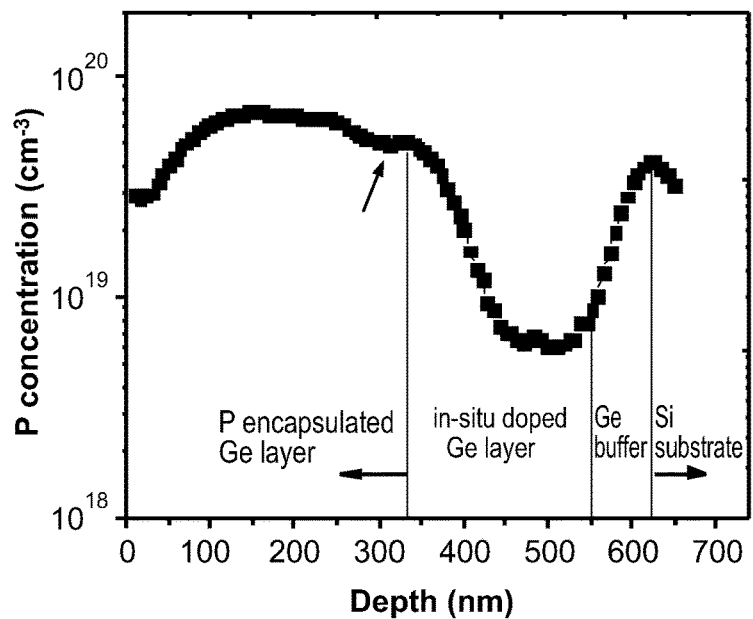
FIG. 8 is a plot of P dopant concentration as a function of depth for a Ge active layer and delta doping layers as in FIG. 3F.

FIG. 8 is a plot of measured P dopant concentration as a function of depth through the delta doping layers and the Ge active layer just after delta doping layer formation, prior to annealing. In the bulk of the Ge layer thickness, a phosphorus doping concentration of about $6 \times 10^{18}$ cm$^{-3}$ was measured. The P peak concentration at ~335 nm depth shows the accumulation of phosphorus in the region of the P-doped encapsulation layers. During the deposition of the intrinsic Ge encapsulation layers between the delta layers, the reactor temperature is kept under 400° C. but P diffusion occurs. Other P concentration peaks within the depth of 335 nm are not very distinct due to asymmetrical P diffusion. The dopant peak is observed to decay into in situ-doped Ge layer with a decay length of 100 nm. The high P dopant concentration at the interface of Ge buffer layer and Si substrate is due to dopant accumulation in the undoped Ge buffer layer, which acts as a dopant trap due to a high dislocation density.

Hall Effect measurements were performed on the as-grown Ge layers to determine the degree of electrically-activated P dopants. The measured active carrier concentration was $1.5 \times 10^{19}$ cm$^{-3}$, compared to the average physical concentration of $4.4 \times 10^{19}$ cm$^{-3}$ determined from the SIMS profile as the integrated P concentration over the depth, including the delta layers, divided by the thickness. This discrepancy in measurement confirms that the P atoms of the delta layers are not electrically activated in Ge layer and that annealing of the structures is preferred to cause P diffusion into the in situ-doped Ge layer to achieve higher doping concentration with good single crystalline quality.

Rapid thermal annealing, under various conditions, was performed on the structures, and SIMS and Hall effect measurements were used to determine the dopant distribution profiles and the electrically activated dopant concentrations. The standard measurement error for the Hall effect measurement setup was ±10%.

Figure 9:
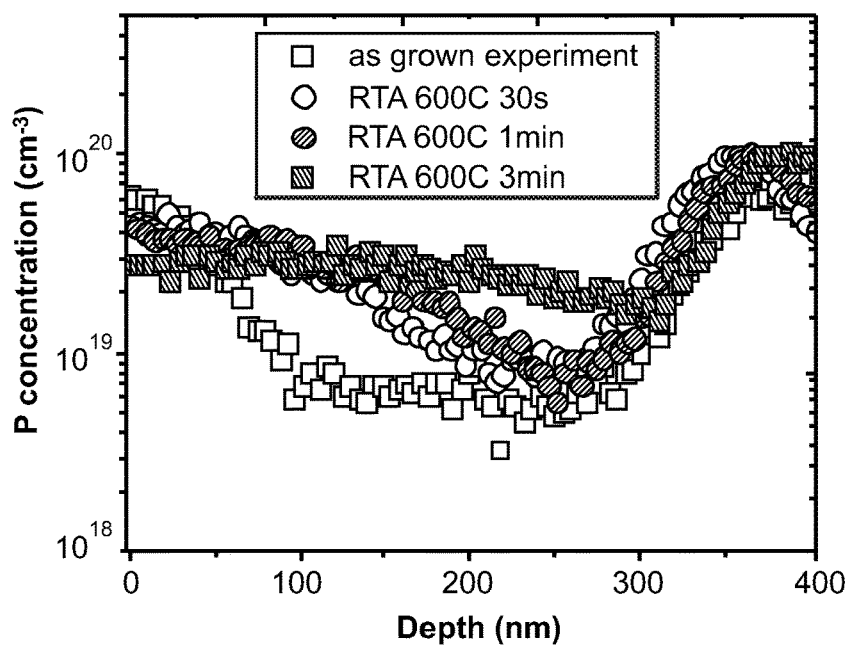
FIG. 9 is a plot of P dopant concentration as a function of depth for a Ge active layer that is in situ doped and includes delta doping layers as in FIG. 3F, subsequent to an ex situ dopant diffusion step.

FIG. 9 is a plot of phosphorus dopant concentration as a function of depth. For clarity, in this plot the location of the interface between the bottom-most delta doping layer and the surface of the Ge active layer is set to zero depth. Driven by the concentration gradient, the P dopant was found to diffuse deeper into Ge active layer from the delta layers with longer annealing times. The annealing times were judged in view of a desire for high carrier concentration and uniform dopant distribution profile through the thickness of the Ge active layer. Based on these considerations, it was concluded that an RTA at 600° C. for 3 min obtained the optimal dopant diffusion for the process parameters employed here. In this case, an evenly distributed average carrier concentration of $2.5 \times 10^{19}$ cm$^{-3}$ was achieved in the single crystalline Ge active layer as measured by SIMS. The Hall Effect measurement data for the 3 min RTA step at 600° C. indicated an activated carrier concentration of $(2.8 \pm 0.3) \times 10^{19}$ cm$^{-3}$ in the bulk of the Ge active layer. This demonstrates that the phosphorus dopant is completely activated by a 3 min RTA step at 600° C.

Figure 10:
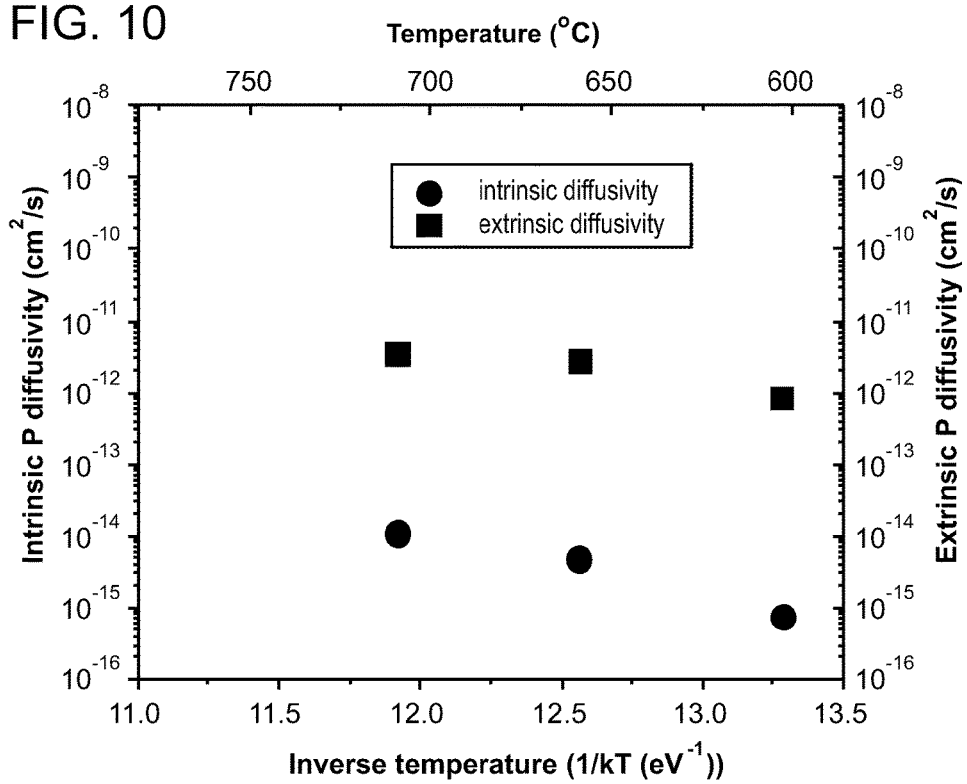
FIG. 10 is a plot of intrinsic and extrinsic diffusivity of P dopant in Ge as a function of temperature.

Based on the data from RTA processes at 600° C., 650° C., and 700° C., the doubly-charged intrinsic diffusion coefficient for Ge was determined and is plotted in FIG. 10. Generally, diffusivity is related to temperature by an Arrhenius characteristic and hence, the expression $D = D_0^* e^{-E_a/kT}$ was employed to fit the three data points. The extracted activation energy, $E_a = 1.98$ eV and the pre-exponential coefficient is $D_0^* = 2.2 \times 10^{-4}$ cm$^2$/s, which is in the order of the predicted calculations. The intrinsic carrier concentration in tensile-strained Ge is $2.09 \times 10^{17}$ cm$^{-3}$ at 600° C. and $3.88 \times 10^{17}$ cm$^{-3}$ at 700° C. Due to the in situ doping step during the Ge active layer growth, carrier concentration in the Ge layer before annealing was increased to $7 \times 10^{18}$ cm$^{-3}$. Therefore, the extrinsic diffusivities in the in-situ doped Ge region, shown as the squares in FIG. 10, are about 2 orders higher than the diffusivities in intrinsic Ge.

These results confirm that the quadratic dependence of diffusivity on carrier concentration for Ge causes the P dopant diffusion to be significantly enhanced by in situ doping. Compared to the intrinsic epitaxial Ge layer grown on Si substrate, diffusion in in situ doped Ge-on-Si film is significantly faster. During annealing, dopant loss is also observed, which can be concluded from the decrease of average P concentration with longer annealing times. Therefore, faster diffusion into the epitaxial Ge layer is preferable to compete with the dopant out-diffusion to the surface and interface.

Figure 11:
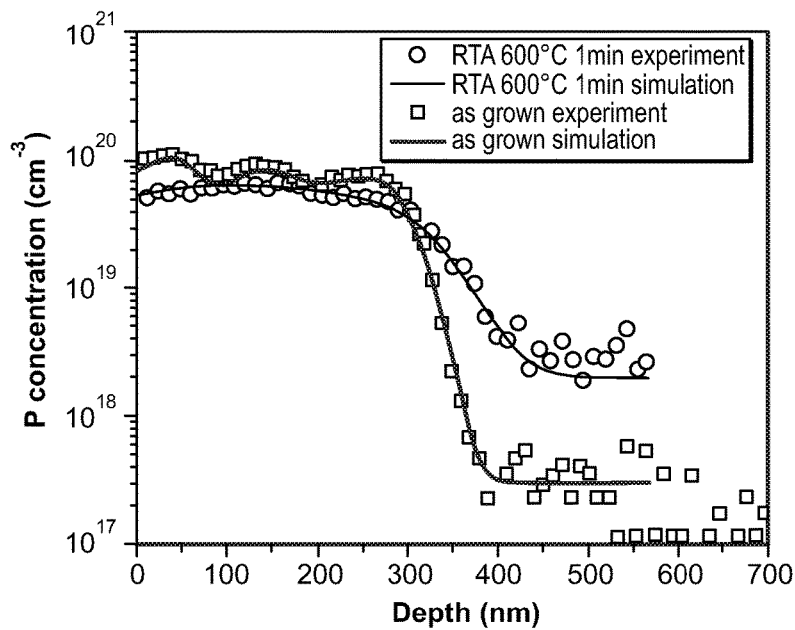
FIG. 11 is a plot of P dopant concentration as a function of depth for a Ge active layer having no background doping.

The enhanced diffusivity resulting from in situ diffusion was further confirmed by comparison of SIMS dopant profile data for in situ-doped Ge active layers and for undoped Ge active layers. FIG. 11 is a plot of phosphorus dopant concentration as a function of depth for the Ge active layer that was grown without in situ doping during growth. In the plot, the interface between the bottom-most delta doping layer and surface of the Ge active layer is at a depth of about 275 nm. The plot shows both the dopant depth profile after delta doping layer formation and after anneal subsequent to delta doping layer formation. In the bulk of the Ge active layer, the dopant concentration is about $3 \times 10^{17}$ cm$^{-3}$. After an RTA step of 1 min at 600° C., the dopant concentration in the bulk of the Ge active layer is about $3 \times 10^{18}$ cm$^{-3}$.

This measurement dramatically compares with the measurement of $(2.8 \pm 0.3) \times 10^{19}$ cm$^{-3}$ that was taken for the phosphorus concentration in the bulk of the Ge active layer after in situ doping and annealing after formation of the delta dopant stack. The combination of the in situ doping step with the ex situ doping step is demonstrated to result in at least one order of magnitude increase in dopant concentration in the bulk of the Ge active layer.

Figure 12:
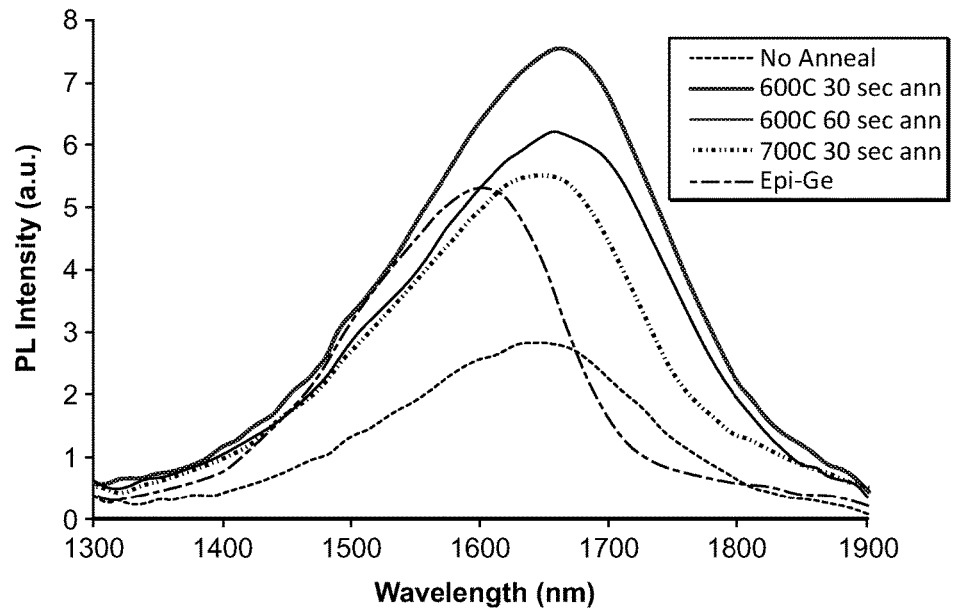
FIG. 12 is a plot of photoluminescence intensity as a function of wavelength for a Ge active layer that is in situ doped and includes delta doping layers as in FIG. 3F, subsequent to an ex situ dopant diffusion step.

To further quantify the activated dopant concentration, there was measured the photoluminescence of the Ge active layer samples under the various annealing conditions. The optically-active dopant concentration is equivalent to the electrically-active concentration and this measurement therefore can provide further evidence of activated dopant concentration. FIG. 12 is a plot of measured photoluminescence intensity as a function of wavelength for annealing at various times and temperatures, as well as for a sample for which no anneal was conducted, and for a Ge active layer, referred to as epi-Ge, which was in situ doped but for which no ex situ doping was conducted. The shift in the peak to longer wavelengths is consistent with the increased carrier concentration.

EXAMPLE 2

Ge In Situ Doping and Ex Situ Doping by Ion Implantation

Ge layers were epitaxially grown on 6" Si (100) substrates using a hot-wall UHVCVD reactor. A 30 nm-thick Ge buffer layer was first directly grown on the Si substrates at a temperature of 360° C. Then a 500 nm-thick Ge layer with in situ-doped phosphorous at a doping level of $1 \times 10^{19}$ cm$^{-3}$ was grown at an elevated temperature of 650° C. with a 3.8 sccm GeH$_4$ gas flow and a 12 sccm PH$_3$ gas flow.

After active layer growth, three different ion implantation processes were conducted, as given in Table I below.

TABLE 1

| # | Tilt angle ° | ions | Energy (keV) | Dose (cm$^{-2}$) | ions | Energy (keV) | Dose (cm$^{-2}$) |
|---|---|---|---|---|---|---|---|
| 1 | 7 | P | 100 | $7.3 \times 10^{15}$ | — | — | — |
| 2 | 7 | P | 100 | $3.5 \times 10^{15}$ | As | 250 | $3.8 \times 10^{15}$ |
| 3 | 7 | P | 100 | $3.5 \times 10^{15}$ | Sb | 375 | $4.1 \times 10^{15}$ |

After implantation, the samples were annealed to diffuse the implanted ions into the Ge active layer. RTA processes having a temperature of 600° C.-800° C., and durations of 30 s-180 s were conducted.

Figure 13:
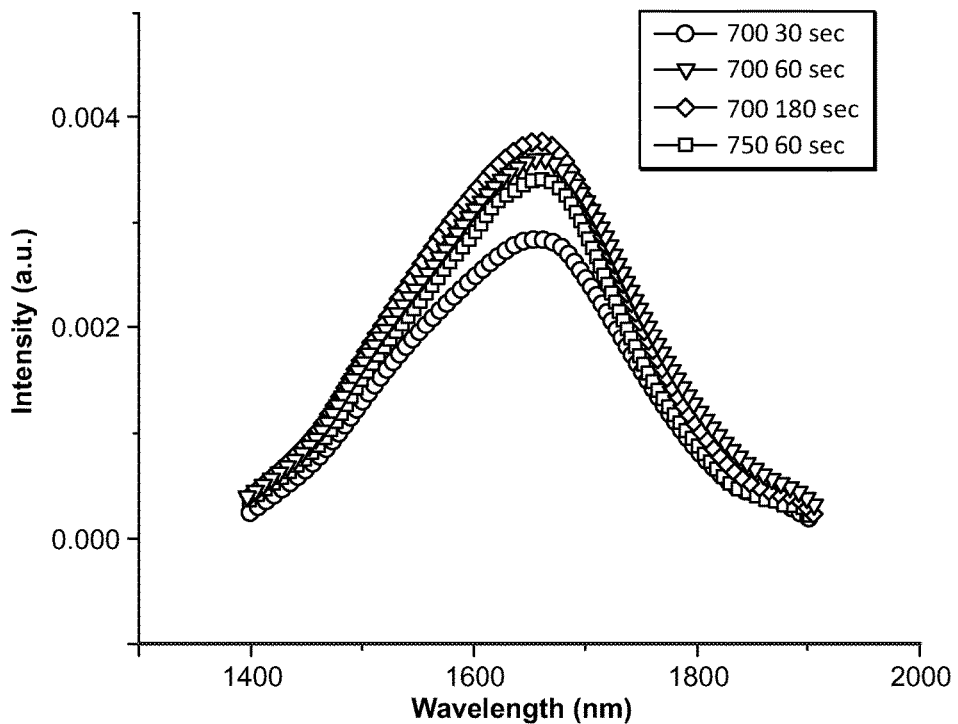
FIG. 13 is a plot of measured photoluminescence intensity as a function of wavelength for a phosphorus-implanted Ge active layer for various implantation annealing conditions.

FIG. 13 is a plot of measured photoluminescence intensity as a function of wavelength for the phosphorus-implanted Ge active layers. The measured peak intensity at a wavelength of 1660 nm corresponds to an activated dopant concentration of about $4 \times 10^{19}$ cm$^{-3}$ that is produced by the phosphorus implantation and annealing at 750° C. for 1 min.

Figure 14:
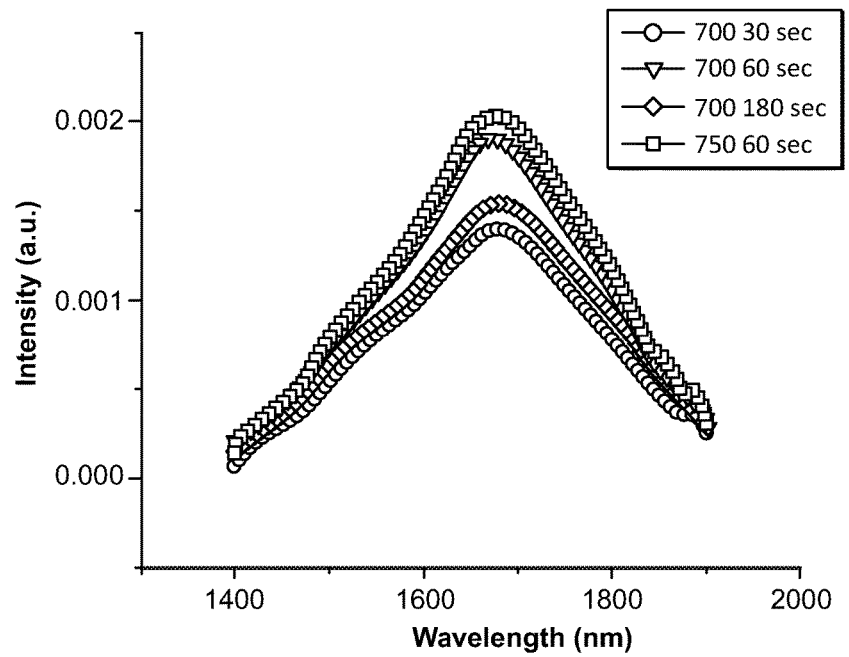
FIG. 14 is a plot of photoluminescence intensity as a function of wavelength for a phosphorus-arsenic co-ion implantation into Ge active layers for various implantation annealing conditions.

FIG. 14 is a plot of photoluminescence intensity as a function of wavelength for the phosphorus-arsenic co-ion implantation combination into Ge active layers. The measured peak intensity at a wavelength of 1680 nm corresponds to an activated dopant concentration of about $5.5 \times 10^{19}$ cm$^{-3}$ that is produced by the phosphorus implantation and annealing at 750° C. for 1 min.

Figure 15:
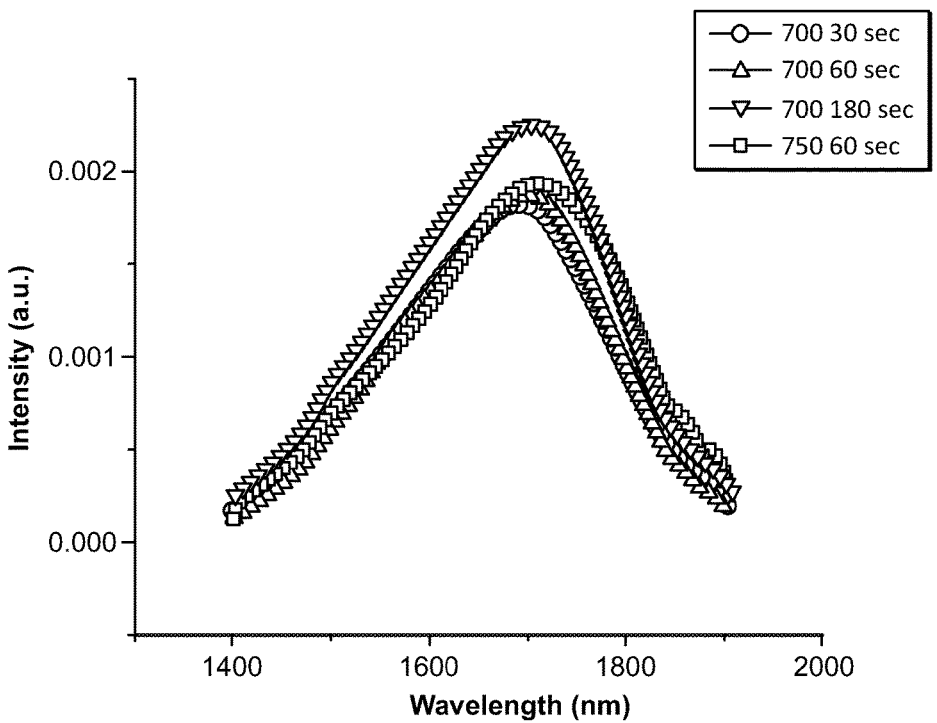
FIG. 15 is a plot of photoluminescence intensity as a function of wavelength for a phosphorus-antimony co-ion implantation combination into Ge active layers for various implantation annealing conditions.

FIG. 15 is a plot of photoluminescence intensity as a function of wavelength for the phosphorus-antimony co-ion implantation combination into Ge active layers. The measured peak intensity at a wavelength of 1700 nm corresponds to an activated dopant concentration of about $8.7 \times 10^{19}$ cm that is produced by the phosphorus implantation and annealing at 700° C. for 3 min.

EXAMPLE 3

Ge Laser Fabrication and Operation

A vertical-injection, electrically-pumped Ge laser was fabricated in the manner of the fabrication sequence of FIGS. 7A-7K described above, employing the process of Example 1 above for producing a Ge buffer layer of 30 nm in thickness and Ge active layer of about 300 nm, doped in situ with phosphorus doping of $1 \times 10^{19}$ cm$^{-3}$, here conducted as mesa growth in a trench window in a silicon dioxide layer as in FIG. 7D. Four encapsulated phosphorus delta layers were formed, with a silicon dioxide capping layer of 100 nm in thickness to prevent out diffusion. Thermal annealing for diffusion of phosphorus from the delta doped layers into the Ge active layer was conducted by RTA at 700° C. for 1 minute. Then the structure was then planarized, as in FIG. 7F, by CMP, to remove the delta doping and capping layers from the active Ge layer surface. The remaining thickness of the Ge active layer after CMP as measured across the substrate and found to vary between 100 nm and 300 nm, depending on substrate location. Due to severe dishing of the waveguides after CMP the supported optical modes in the waveguides could not be determined exactly. Up to six cavity modes can be supported in the largest waveguides.

In the manner of FIG. 7G-7K, a 180 nm-thick amorphous-Si layer was then deposited by PECVD and subsequently phosphorus-implanted to a doping level of $10^{20}$ cm.$^{-3}$. After a dopant activation annealing step at 750° C. for 1 minute, a metal layer stack consisting of Ti and Al was deposited for forming top and bottom contacts. The oxide trench was determined to provide excellent electrical current confinement. In order to assure even carrier injection into the n-type Ge active layer, the top contact metal was deposited on top of the Ge layer. After dicing, the waveguides were cleaved to expose the Ge active layer waveguide facets. A thin oxide layer was deposited on the facets to protect against contamination and catastrophic optical mirror damage which was observed in devices that did not have oxide protection.

Figure 16:
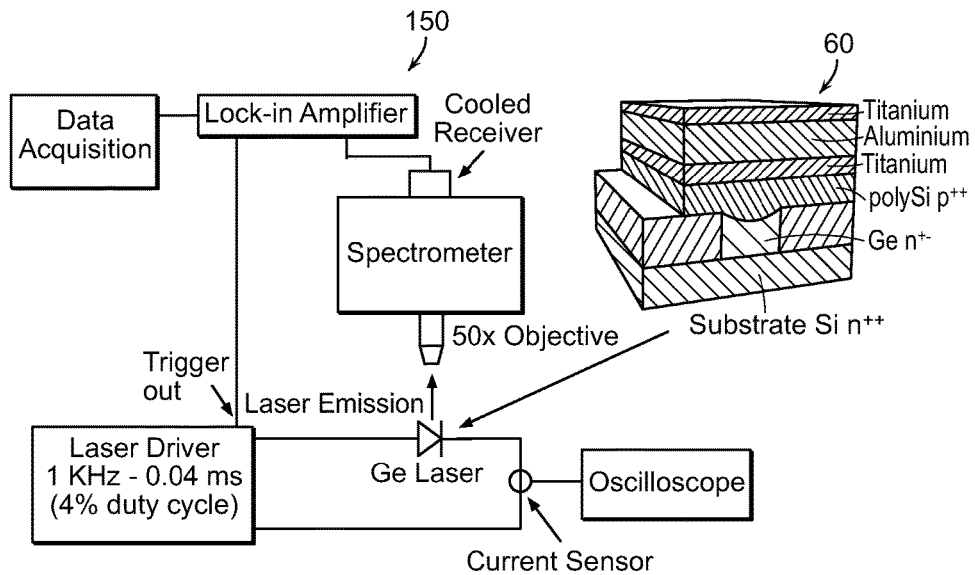
FIG. 16 is a diagram and schematic view of a vertical-injection Ge laser body and a test set-up employed for experimentally measuring lasing emission from the laser body.

Emission from the Ge waveguide cavity was measured using a Horiba Micro PL system equipped with a cooled InGaAs detector with lock-in detection. The emission power measurement was calibrated using light from a commercial 1550 nm laser that was coupled into a single mode optical fiber with the fiber end at the sample location. In calibration it was verified that the detection was linear with input power. Electrical pumping of the Ge cavity was supplied by a pulse generator with current pulse widths in the range of 20 μs to 100 ms. The duty cycle was varied between 2% and 50%, typically 4%, to reduce electrical current heating effects. The laser was contacted with metal probes and the current was measured using an inductive sensor placed directly in the biasing circuit. FIG. 16 illustrates the experimental setup 150 for characterization of the Ge laser 60.

The Ge laser cavity was electrically pumped and the resulting emission spectrum measured. All measurements were performed with the sample mounted on a thermoelectric cooler at 15° C. The local device temperature was likely higher, however, due to the high current injection, but could not be reliably determined.

Figure 17A:
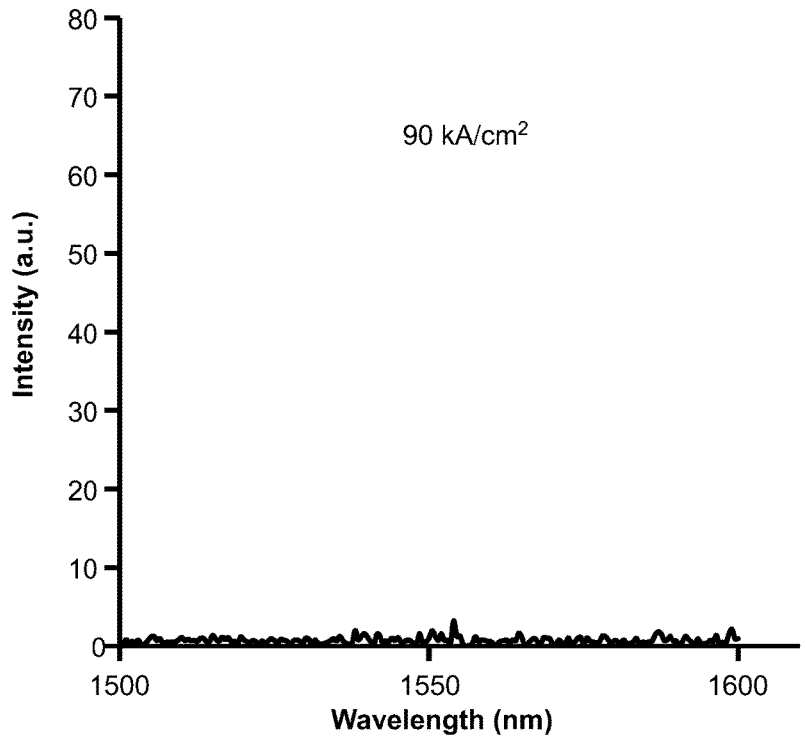
FIGS. 17A-17B are plots of measured laser intensity as a function of wavelength for the laser of FIG. 16, below the laser's lasing threshold, and above the laser's lasing threshold, respectively.
Figure 17B:
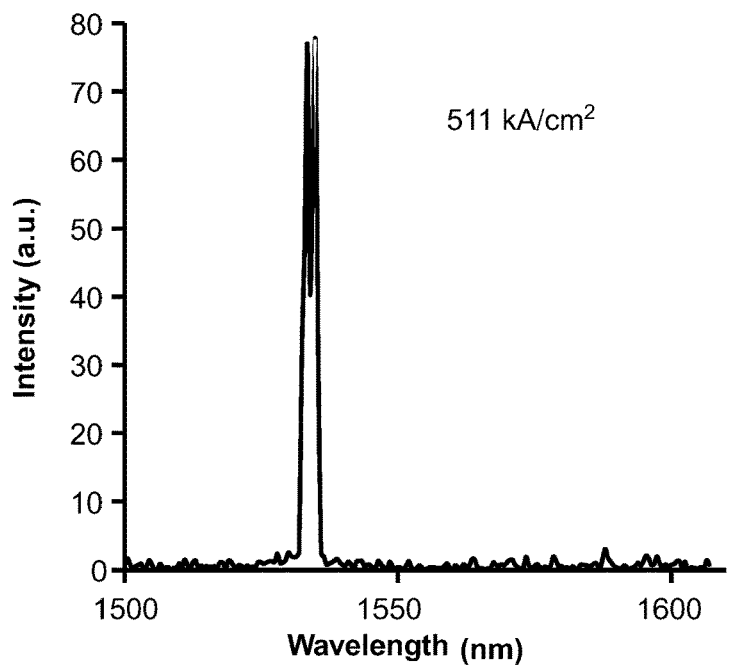

FIG. 17A is a plot of the measured emission spectrum below the lasing threshold. FIG. 17B is a plot of the measured emission spectrum above the lasing threshold. The spectra employed short integration times to assure wide spectrum analyses. The plot of FIG. 17A demonstrates that no spectral features above the noise floor were emitted by the laser below the lasing threshold. When the injection current density was increased above threshold, sharp laser lines appeared, as shown in the plot of FIG. 17B. The observed linewidth of the individual lines is below 1.2 nm, which is the spectral resolution of the measurement set-up. The lasing spectrum intensity plot of FIG. 17B shows two lines. The estimate of the cavity free spectral range (FSR) is 1 nm, and the line spacing in the plot, 3 nm, is a possible multiple of the FSR.

Figure 18:
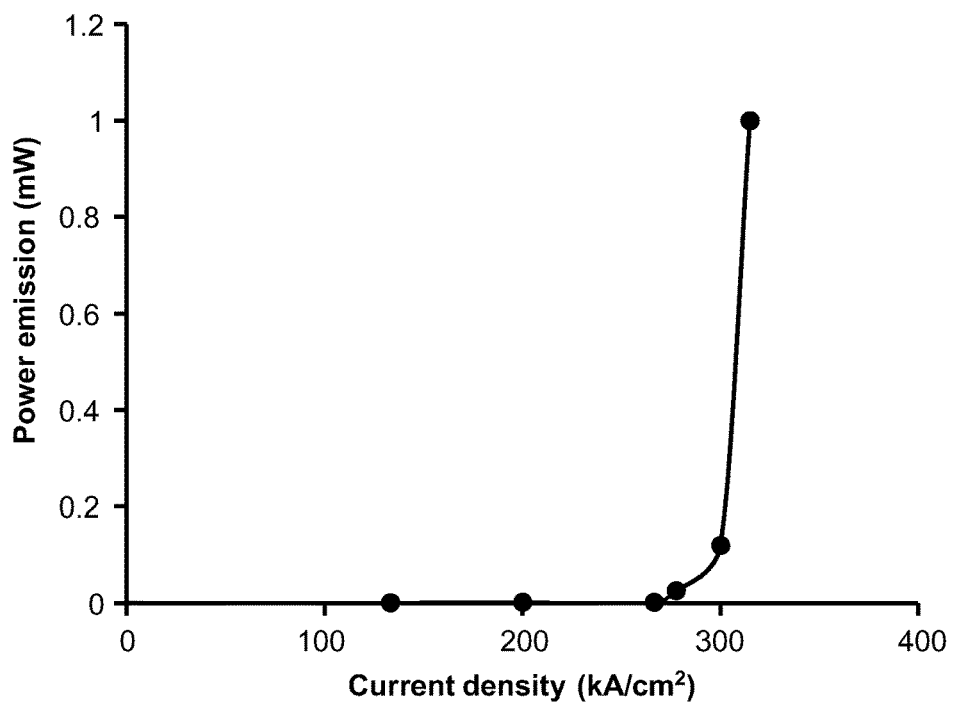
FIG. 18 is a plot of the measured laser emission power as a function of current density for the laser of FIG. 16.

FIG. 18 is a plot of the laser emission power as a function of current density. The lasing threshold at about 280 kA/cm$^2$ is clearly visible. This measurement was taken using the measurement system of FIG. 16 with a wide instrumental spectral resolution of 10 nm. The number of data points was limited by metal contact breakdown at high current levels. The optical emission power of 1 mW is a lower estimate and was measured for a wavelength range of 1500 nm-1650 nm.

These examples demonstrate that the two-step situ-ex situ high-concentration doping method can produce uniform, activated n-type doping in Ge as a laser gain medium, at a doping concentration that is sufficient to produce in the gain medium a guided mode that overcomes the losses in an electrically-pumped laser configuration of the gain material, to enable the integration of a Ge laser gain medium into a silicon-based electro-optical system.

As described above, the two-step in situ-ex situ doping method is not limited to doping of Ge; such is provided as an exemplary example. Any semiconducting material for which electrical doping is desired can be processed in accordance with the two-step in situ-ex situ doping method. The method enables the production of devices and systems not historically attainable by conventional doping techniques.

It is recognized, of course, that those skilled in the art may make various modifications and additions to the processes of the invention without departing from the spirit and scope of the present contribution to the art. Accordingly, it is to be understood that the protection sought to be afforded hereby should be deemed to extend to the subject matter of the claims and all equivalents thereof fairly within the scope of the invention.

We claim:

1. A method for electrically doping a semiconducting material, the method comprising:
forming a layer of germanium having a germanium layer thickness, while in situ incorporating phosphorus dopant atoms at a concentration of at least about $5\times10^{18}$ cm$^{-3}$ through the thickness of the germanium layer during formation of the germanium layer, the formed germanium layer having a first phosphorus dopant concentration;
ex situ incorporating additional phosphorus dopant atoms through the thickness of the germanium layer, after formation of the germanium layer, to produce through the germanium layer thickness a total phosphorus dopant concentration of at least about $2\times10^{19}$ cm$^{-3}$;
said ex situ incorporating additional phosphorus dopant atoms at the germanium layer; and
diffusing phosphorus dopant atoms from the reservoir through the germanium layer; and
after diffusing phosphorus dopant atoms through the thickness of the germanium layer, removing the phosphorus dopant atom reservoir from the germanium layer.

2. The method of claim 1 wherein forming a layer of germanium comprises vapor-phase forming the germanium layer and vapor-phase incorporation of phosphorus dopant atoms into the germanium layer.

3. The method of claim 2 wherein forming a layer of germanium comprises exposing a substrate to a first vapor-phase species that forms the germanium layer on the substrate, while simultaneously exposing the substrate to a second vapor-phase species that forms the phosphorus dopant atoms in the germanium layer.

4. The method of claim 1 wherein forming a layer of germanium comprises a process selected from the group of chemical vapor deposition, molecular beam epitaxy, and atomic layer deposition; and wherein forming a reservoir of phosphorus dopant atoms at the layer comprises a process selected from the group of chemical vapor deposition, molecular beam epitaxy, and atomic layer deposition.

5. The method of claim 4 wherein forming a layer of germanium consists of chemical vapor deposition of the germanium layer, and wherein forming a reservoir of phosphorus dopant atoms at the germanium layer consists of chemical vapor deposition of the phosphorus dopant atom reservoir.

6. The method of claim 1 wherein diffusing phosphorus dopant atoms comprises heating the germanium layer and the phosphorus dopant atom reservoir to a temperature sufficient to cause diffusion of phosphorus dopant atoms from the reservoir through the thickness of the germanium layer.

7. The method of claim 1 wherein forming a reservoir of phosphorus dopant atoms comprises forming at least a partial monolayer of phosphorus dopant atoms on a surface of the germanium layer.

8. The method of claim 4 further comprising forming an encapsulation layer on top of the at least partial monolayer of phosphorus dopant atoms.

9. The method of claim 8 wherein forming at least a partial monolayer of phosphorus dopant atoms comprises cyclically forming at least a partial monolayer of phosphorus dopant atoms and an encapsulation layer of germanium to produce a stack of encapsulated phosphorus dopant atom layers on a surface of the germanium layer.

10. The method of claim 1 wherein forming a reservoir of phosphorus dopant atoms comprises ion implantation of phosphorus dopant atoms into the germanium layer.

11. The method of claim 1 wherein in situ incorporating phosphorus dopant atoms into the germanium layer comprises doping the germanium layer with an electrically activated phosphorus dopant concentration of at least about $1\times10^{19}$ cm$^{-3}$.

12. The method of claim 4 wherein ex situ incorporating additional phosphorus dopant atoms into the in situ-doped germanium layer comprises doping with germanium layer with a total electrically activated dopant concentration of at least about $4\times10^{19}$ cm$^{-3}$.

* * * * *